United States Patent
Nanba et al.

(10) Patent No.: US 6,930,935 B2
(45) Date of Patent: Aug. 16, 2005

(54) REDUNDANCY CIRCUIT AND SEMICONDUCTOR DEVICE USING THE SAME

(75) Inventors: Yasuhiro Nanba, Tokyo (JP); Hiroshi Watanabe, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 10/770,422

(22) Filed: Feb. 4, 2004

(65) Prior Publication Data

US 2004/0205428 A1 Oct. 14, 2004

(30) Foreign Application Priority Data

Feb. 14, 2003 (JP) .......................................  2003-037392
Apr. 15, 2003 (JP) .......................................  2003-110718

(51) Int. Cl.$^7$ .............................................. G11C 7/00
(52) U.S. Cl. ................. 365/200; 365/225.7; 365/230.06
(58) Field of Search ........................... 365/200, 225.7, 365/230.06, 20.06

(56) References Cited

U.S. PATENT DOCUMENTS 4,791,319 A * 12/1988 Tagami et al. .............. 365/200

FOREIGN PATENT DOCUMENTS

| JP | 3-22298 A | 1/1991 |
|---|---|---|
| JP | 4-205897 A | 7/1992 |
| JP | 2002-133895 A | 5/2002 |

* cited by examiner

Primary Examiner—Huan Hoang
(74) Attorney, Agent, or Firm—Sughrue Mion, PLLC

(57) ABSTRACT

A redundancy control circuit includes a redundancy decoder and a decoder killer circuit. The redundancy decoder includes a plurality of fuse circuits corresponding to a plurality of determination signals which are previously activated, and each of the plurality of fuse circuits contains a plurality of fuse sections each containing a fuse. The decoder killer circuit generates a killer signal when at least one of the plurality of determination signals is active, and the killer signal is outputted to an external unit in a first check mode. One of the plurality of fuse circuits is selected and determination signals corresponding to non-selected fuse circuits are inactivated. A specific fuse section of the selected fuse circuit inactivates the determination signal to provide indication of whether the fuse section is cut.

26 Claims, 16 Drawing Sheets

Fig. 6

| No. | DECODER KILL ENTRY SIGNAL 40 | RTT SIGNAL 41/ RTN SIGNAL 42 | REDUNDANCY DECODER SELECTING CIRCUIT 2 | REDUNDANCY DECODER 4 | MODE |
|---|---|---|---|---|---|
| ① | L | L/L | DISABLED | DEPENDING ON ADDRESS | NORMAL |
| ② | L | H/H | DEPENDING ON ADDRESS | DISABLED | REDUNDANCY CELL CHECK TEST |
| ③ | H | L/L | DISABLED | DEPENDING ON ADDRESS | ROLL CALL TEST |
| ④ | H | H/L or L/H | DEPENDING ON ADDRESS | DEPENDING ON ADDRESS | FUSE CHECK TEST |

Fig. 9

| No. | DECODER KILL ENTRY SIGNAL 40 | RTT SIGNAL 41/ RTN SIGNAL 42 | TSEL SIGNAL | REDUNDANCY DECODER SELECTING CIRCUIT 2A | REDUNDANCY DECODER 4 | MODE |
|---|---|---|---|---|---|---|
| ① | L | L/L | L | DISABLED | DEPENDING ON ADDRESS | NORMAL |
| ② | L | H/H | H | DEPENDING ON ADDRESS | DISABLED | REDUNDANCY CELL CHECK TEST |
| ③ | H | L/L | L | DISABLED | DEPENDING ON ADDRESS | ROLL CALL TEST |
| ④ | H | H/L or L/H | H | DEPENDING ON ADDRESS | DEPENDING ON ADDRESS | FUSE CHECK TEST |
| ⑤ | H | L/L | H | DEPENDING ON ADDRESS | DEPENDING ON ADDRESS | FUSE REVERSE CHECK TEST |

Fig. 17

| No. | DECODER KILL ENTRY SIGNAL 40 | RTT SIGNAL 41/ RTN SIGNAL 42 | TSEL1/ TSEL2 | REDUNDANCY DECODER SELECTING CIRCUIT 2C | REDUNDANCY DECODER 4 | MODE |
|---|---|---|---|---|---|---|
| ① | L | H/H | …/L | DISABLED | DEPENDING ON ADDRESS | NORMAL |
| ② | L | L/L | H/H | DEPENDING ON ADDRESS | DISABLED | REDUNDANCY CELL CHECK TEST |
| ③ | H | H/H | …/L | DISABLED | DEPENDING ON ADDRESS | ROLL CALL TEST |
| ④ | H | H/L or L/H | H/H | DEPENDING ON ADDRESS | DEPENDING ON ADDRESS | FUSE CHECK TEST |
| ⑤ | H | L/L | H/H | DEPENDING ON ADDRESS | DEPENDING ON ADDRESS | FUSE REVERSE CHECK TEST |

… : don't care

REDUNDANCY CIRCUIT AND SEMICONDUCTOR DEVICE USING THE SAME

BACKGROUND OF THE INVENTION

1. Field of the Invention

The present invention relates to a redundancy circuit and a semiconductor memory device using the same.

2. Description of the Related Art

Conventionally, in a semiconductor memory such as a RAM (random access memory) or a semiconductor integrated circuit with a memory circuit built therein, a redundancy circuit is provided to contains redundant memory columns or memory rows and a address setting circuit storing defective addresses, in order to relieve defective bits contained in a memory array and to improve a production yield.

Generally, it is carried out to set a defective address in the redundancy circuit by physically cutting a programmable fuse with laser. The redundant address stored through the cutting of the fuse as mentioned above is compared with an inputted address, and a memory row or column is replaced by a redundant memory row or column when both are coincident with each other.

FIG. 1 is a block diagram showing the structure of a semiconductor memory device containing a conventional redundancy circuit. Referring to FIG. 1, the semiconductor memory device has the redundancy circuit on the row side. However, the semiconductor memory device may have a redundancy circuit on the column side. The structure of the redundancy circuit on the column side is same as the redundancy circuit on the row side and it will be apparent to a person in the art.

Referring to FIG. 1, a redundancy circuit relating section mainly has a control logic circuit 115, a redundant cell check entry block 112, a decoder kill entry block 113, a redundancy control block 110, a row redundant cell array 125 and a data output buffer 128. The redundancy control block 110 has a redundancy decoder selecting circuit 102, a redundancy decoder 104, and a decoder killer circuit 106. The row redundant cell array 125 has a plurality of redundant cell rows.

The redundant cell check entry block 112 generates a redundant cell check entry signal 151 based on a control signal from the control logic circuit 115 and an inputted address, and supplies it to the redundancy decoder selecting circuit 102 and the redundancy decoder 104. The decoder kill entry block 113 generates a decoder kill entry signal 140 based on a control signal from the control logic circuit 115 and the inputted address, and supplies it to the data output buffer 128.

The redundancy decoder selecting circuit 102 and the redundancy decoder 104 in the redundancy control block 110 are connected by a common line and output a redundancy determination signal 143. The redundancy decoder selecting circuit 102 receives the address from a row address buffer & refresh counter 119 and a redundant cell check entry signal 151 from the entry block 112, and outputs the redundancy determination signal 143 together with the redundancy decoder 104. The redundancy decoder 104 receives the address from the row address buffer & refresh counter 119, the redundant cell check entry signal 151 from the entry block 112 and a control signal 145 from the control logic circuit 115, and generates the redundancy determination signal 143. The redundancy determination signal 143 generated by the redundancy decoder selecting circuit 102 and the redundancy decoder 104 is outputted to the decoder killer circuit 126 and the row redundant cell array 125. Thus, the row redundant cell array 125 specifies one of the plurality of redundant cell rows based on the redundancy determination signal 143. The decoder killer circuit 106 in the redundancy control block 110 generates a decoder killer signal 144 from the redundancy determination signal 143 to indicate whether or not the redundant cell array 125 is used. The decoder killer signal 144 is supplied to the data output buffer 128 and the row decoder 124. The row decoder 124 stops the operation in response to decoding killer signal. Also, the data output buffer 128 outputs the decoder killer signal 144 or a memory cell data to an external unit through an I/O terminal in response to the decoder kill entry signal 140.

FIG. 2 is a block diagram showing the detailed structure of the redundancy control block 110 shown in FIG. 1. In this example, it is supposed that it is possible to select which of the four redundant cell rows in the row redundant cell array 125. Referring to FIG. 2, the redundancy decoder selecting circuit 102 has address setting circuit 102-0 and four selecting circuits 102-1 to 102-4 with a same circuit structure. Also, the redundancy decoder 104 has the address setting circuit 104-0 and fuse circuits 104-1 to 104-4. The selecting circuits 102-1 to 102-4 and the fuse circuits 104-1 to 104-4 are connected by corresponding redundancy determination signal lines 143 (143-1, 143-2, 143-3, 143-4: not shown).

The fuse circuit 104-1 has a P-channel transistor having a source connected with a power supply potential Vcc. A precharge signal 145 is supplied from the control logic circuit 115 to the gate of the P-channel transistor. The drain of P-channel transistor is connected with the redundancy determination signal 143-1. Also, the fuse circuit 104-1 has a fuse section to each of a True side and a Not side of each of address bits A0 to Aj. The fuse section contains an N-channel transistor and a fuse. The drain of the N-channel transistor is connected with the redundancy determination signal 143-1 and the source is connected with the one end of the fuse. The other end of the fuse is grounded. A corresponding True address bit or Not address bit is supplied to the gate of each N-channel transistor.

Also, each of the fuse circuits 104-2, 104-3, 104-4 has a same circuit structure as the fuse circuit 104-1. The fuse of each fuse section in the fuse circuits 104 (104-1, 104-2, 104-3 and 104-4) is previously cut and programmed with laser in accordance with an address used for a redundancy operation.

The address setting circuit 104-0 contains NOR circuits 165-1 and 165-2 and an inverter 165-3 to the address bit A0. One of the input terminals of the NOR circuit 165-1 is connected with the redundant cell check entry signal 151, and the other input terminal of the NOR circuit 165-1 is connected with the address bit A0. The inverter 165-3 inverts the address bit A0. One of the input terminals of the NOR circuit 165-2 is connected with the redundant cell check entry signal 151, and the other input terminal of the NOR circuit 165-2 is connected with an inverted address bit A0. The address setting circuit 104-0 has the same circuits as the circuit for the address bit A0 for each of the address bits A1 to Aj. Each of the outputs of the NOR circuits of the address setting circuit 104-0 is supplied to the gate of the N-channel transistor on the True side or the Not side corresponding to the address bit of each of the fuse circuits.

The selecting circuit 102-1 has two N-channel transistors. The drain of each of the N-channel transistors is connected with the redundancy determination signal 143-1 as the common signal. The source of each of the N-channel transistors is grounded. Each of the selecting circuits 102-2, 102-3 and 102-4 has the same circuit structure as the selecting circuit 102-1.

The address setting circuit 102-0 has an inverter 160, NOR circuits 161-1 and 161-2 and an inverter 161-3 to an address bit RA0, and the NOR circuits 162-1 and 162-2 and an inverter 162-3 to an address bit RA1. The inverter 160 inverses the redundant cell check entry signal 151. One of the input terminals of the NOR circuit 161-1 is connected with the inverted redundant cell check entry signal 151, and the other input terminal of the NOR circuit 161-1 is connected with the address bit RA0. The inverter 161-3 inverts the address bit A0. One of the input terminals of the NOR circuit 161-2 is connected with the inverted redundant cell check entry signal 151, and the other input terminal of the NOR circuit 161-2 is connected with the inverted address bit RA0. The address setting circuit 102-0 has the same circuit structure as the circuit structure for the address bit RA0 for the address bit RA1. The output of the NOR circuit 161-1 of the address setting circuit 102-0 is supplied to the gate of one of the N-channel transistors in the selecting circuits 102-1 and 102-2. The output of the NOR circuit 161-2 is supplied to the gate of one of the N-channel transistors of the selecting circuits 102-3 and 102-4. The output of the NOR circuit 162-1 is supplied to the gate of the other N-channel transistor of the selecting circuits 102-1 and 102-3. The output of the NOR circuit 162-2 is supplied to the gate of the other N-channel transistor of the selecting circuits 102-2 and 102-4.

The decoder killer circuit 106 has an NOR circuit which inputs the redundancy determination signals 143-1, 143-2, 143-3, 143-4 and generates the decoder killer signal 144.

The address bits RA0 and RA1 supplied to the redundant selection decoder 102 are different from the address bits A0 to Aj supplied to the redundancy decoder 104. The address bits RA0 and RA1 may be supplied from external terminals or may be generated inside.

The redundancy circuit has three operation modes, i.e., (1) a normal mode, (2) a redundant cell check test mode, and (3) a roll call test mode. In (1) the normal mode, one redundant cell row of the row redundant cell array 125 is accessed which row is specified based on the address from the row address buffer 119. In (2) the redundant cell check test mode, whether or not the row redundant cell array is normal is tested. Lastly, in (3) the roll call test mode, whether or not the row redundant cell array 125 is used is tested. It should be noted that the fuse of each fuse circuit of the redundancy decoder 104 is previously cut in accordance with the address of the redundant memory cell of the memory cell array 125.

The above three operation modes will be described. In either of the three operation modes, the precharge signal 145 of an L level is first supplied from the control logic circuit 115 to the redundancy decoder 104 as a control signal. The P-channel transistors of the fuse circuits 104-1, 104-2, 104-3, and 104-4 are turned on. Thus, the redundancy determination signals 143-1, 143-2, 143-3 and 143-4 corresponding to the fuse circuits 104-1, 104-2, 104-3, and 104-4 are set to the power supply voltage Vcc (H level).

In (1) the normal mode, the redundant cell check entry block 112 generates the redundant cell check entry signal 151 of the L level based on the control signal from the control logic circuit 115 and the inputted address. Also, the decoder kill entry block 113 outputs the decoder kill entry signal 140 of the L level based on the control signal from the control logic circuit 115 and the inputted address. In case of the redundant cell check entry signal 151 of the L level, the outputs of the NOR circuits 161-1, 161-2, 162-1, and 162-2 always becomes the L level because the output of the inverter 160 of the address setting circuit 102-0 becomes the H level. As a result, all the N-channel transistors of the selecting circuits 102-1, 102-2, 102-3, and 102-4 become an OFF state and the redundancy decoder selecting circuit 102 is set to the disable state. Therefore, the selecting circuits 102-1, 102-2, 102-3, and 102-4 do not have an influence on the redundancy determination signal 143.

In the address setting circuit 104-0 of the redundancy decoder 104, all the NOR circuits are active because the redundant cell check entry signal 151 is in the L level and the output of each NOR circuit changes in accordance with the address bits A0 to Aj supplied from the row address buffer 119.

The fuses corresponding to the supplied address bits A0 to Aj are generally cut. However, in case that all the fuses are not yet cut, all the redundancy determination signals 143-1, 143-2, 143-3, and 143-4 corresponding to the fuse circuits 104-1, 104-2, 104-3, and 104-4 become the L level. The redundancy determination signals 143 (143-1, 143-2, 143-3, and 143-4) are outputted to the row redundant cell array 125 and the decoder killer circuit 106. The row redundant cell array 125 ignores all the redundancy determination signals of the L level. The decoder killer circuit 106 generates the decoder killer signal 144 of the H level based on the redundancy determination signals 143 of the L level and outputs it to the row decoder 124 and the data output buffer 128. At this time, because the decoder kill entry signal 140 of the L level is outputted from the decoder kill entry block 113, the decoder killer signal 144 is never outputted from the data output buffer 128. Also, when the decoder killer signal 144 is in the H level, the row decoder 124 operates normally. Thus, the read/write operation is carried out through a sense amplifier 123, a data control logic circuit 121, a latch circuit 127, a data output buffer 128, and a data input buffer 129, using a memory cell array 126.

On the other hand, when either of the redundancy determination signals 143-1, 143-2, 143-3, and 143-4 corresponding to the fuse circuits 104-1, 104-2, 104-3, and 104-4 becomes the H level based on the address bits A0 to Aj, the decoder killer circuit 106 generates and outputs the decoder killer signal 144 of the L level to the row decoder 124 and to the data output buffer 128. At this time, because the decoder kill entry signal 140 of the L level is outputted from the decoder kill entry block 113, the decoder killer signal 44 is never outputted from the data output buffer 128. Also, the row decoder 124 is set to the disable state in response to the decoder killer signal 144 of the L level and stops the operation. Therefore, the memory cell array 126 is never used. Also, the redundancy determination signals 143-1, 143-2, 143-3, and 143-4 are supplied to the row redundant cell array 125 and one redundant cell row in the row redundant cell array 125 is selected. The read/write operation is carried out to the selected redundant cell row through the sense amplifier 123, the data control logic circuit 121, the latch circuit 127, the data output buffer 128, and the data input buffer 129.

Next, the operation of (2) the redundant cell check test mode will be described. In (2) the redundant cell check test mode, a test mode entry block 112 outputs the redundant cell check entry signal 151 of the H level based on the control signal from the control logic circuit 115 and the inputted address. Also, the decoder kill entry block 113 outputs the decoder kill entry signal 140 of the L level based on the control signal from the control logic circuit 115 and the inputted address. Because the redundant cell check entry signal 151 is in the H level, the outputs of all the NOR circuits become the L level in the address setting circuit 104-0 of the redundancy decoder 104. Therefore, all the N-channel transistors in the fuse circuits 4-1, 4-2, 4-3, 4-4 become the OFF state and the redundancy decoder 104 does not have an influence on the redundancy determination signal 143.

On the other hand, the output of the inverter 160 of the address setting circuit 102-0 of the redundancy decoder selecting circuit 102 is set to the L level, and the outputs of the NOR circuits 161-1, 161-2, 162-1 and 162-2 of the address setting circuit 102-0 are determined based on the address bits RA0 and RA1. As the result, one of the redundancy determination signals 143-1, 143-2, 143-3 and 143-4 of the selecting circuits 102-1, 102-2, 102-3, and 102-4 is set to the H level, and all the other ones become the L level based on the address bits RA0 and RA1.

The redundancy determination signals 143 (143-1, 143-2, 143-3, and 143-4) are outputted to the row redundant cell array 125 and the decoder killer circuit 106. Because either of the redundancy determination signals 143 is in the H level, the decoder killer circuit 106 generates the decoder killer signal 144 of the L level and outputs to the row decoder 124 and to the data output buffer 128. At this time, because the decoder kill entry signal 140 of the L level is outputted from the decoder kill entry block 113, the decoder killer signal 144 is never outputted from the data output buffer 128. Also, when the decoder killer signal 144 is in the L level, the row decoder 124 is set to the disable state in response to the decoder killer signal 144 of the L level and stops the operation. Therefore, the memory cell array 126 is never used. Also, the redundancy determination signals 143 are supplied to the row redundant cell array 125, and the redundant cell row of the row redundant cell array 125 corresponding to the redundancy determination signal 143 of the H level is selected. The read/write operation is carried out through the sense amplifier 123, the data control logic circuit 121, the latch circuit 127, the data output buffer 128, and the data input buffer 129 to the selected redundant cell row.

At this time, if the address bits RA0 and RA1 supplied from the row address buffer 119 are changed, the data can be read in order from the redundant cell row of the row redundant cell array 125 and the state of the redundant cell row can be checked.

Next, the operation of (3) the roll call test mode will be described. In (3) the roll call test mode, the redundant cell check entry block 112 outputs the redundant cell check entry signal 151 of the L level based on the control signal from the control logic circuit 115 and the inputted address. Also, the decoder kill entry block 113 outputs the decoder kill entry signal 140 of the H level to the data output buffer 128 based on the control signal from the control logic circuit 115 and the inputted address. Therefore, the output of the inverter 160 of the address setting circuit 102-0 of the redundancy decoder selecting circuit 102 becomes the H level, all the NOR circuits 161-1 of the address setting circuit 102-0, 161-2, 162-1 and 162-2 output the L level. As the result, all the N-channel transistors of the selecting circuits 102-1, 102-2, 102-3, and 102-4 become the OFF state and the redundancy decoder selecting circuit 102 is set to the disable state. Therefore, the selecting circuits 102-1, 102-2, 102-3, and 102-4 do not have an influence on the redundancy determination signal 143 and also the redundancy decoder selecting circuit 102 does not have an influence on the selection of the fuse circuit.

On the other hand, at the address setting circuit 104-0 of the redundancy decoder 104, all the NOR circuits are active and the output of the NOR circuit changes in accordance with the address bits A0 to Aj supplied from the row address buffer 119.

When the fuse circuit in which a fuse is cut in correspondence to the inputted address bits A0 to Aj exists, either of the redundancy determination signals 143-1, 143-2, 143-3, and 143-4 of the fuse circuits 104-1, 104-2, 104-3, and 104-4 is set to the H level based on the address bits A0 to Aj. In this case, the redundancy determination signals 143-1, 143-2, 143-3, and 143-4 are outputted to the decoder killer circuit 106 and the row redundant cell array 125. The decoder killer circuit 106 generates and outputs the decoder killer signal 144 of the L level to the row decoder 124 and the data output buffer 128. At this time, because the decoder kill entry signal 140 of the H level is outputted from the decoder kill entry block 113, the decoder killer signal 144 is outputted from the data output buffer 128. Also, the row decoder 124 is set to the disable state in response to the decoder killer signal 144 of the L level and stops the operation. Therefore, the memory cell array 126 is never used. Also, the redundancy determination signals 143-1, 143-2, 143-3, and 143-4 are supplied to the row redundant cell array 125 and the redundant cell row corresponding to the H level of the row redundant cell array 125 is selected. Because the decoder kill entry signal 140 is in the H level even if data is supposed to have been read through the sense amplifier 123, the data control logic circuit 121, and the latch circuit 127 from the selected redundant cell row, data from the redundant cell row is never outputted from the data output buffer 128.

By the way, it is demanded to individually test whether or not the fuses are in the programmed state and whether or not a fuse of a specific fuse section of a specific fuse circuit of the redundancy decoder 104 is cut. However, it is conventionally impossible to check whether one optional fuse is cut and whether or not the fuse is in the programmed state.

In conjunction with the above description, technique disclosed in Japanese Laid Open Patent Application (JP-A-Heisei 3-22298) will be described with reference to FIG. 3. In this conventional example, the detecting circuit is described only which carries out the roll call test operation simply.

A redundancy decoder is composed of EX-OR (XOR) circuits 514A0 to 514An which carry out an exclusive OR operation of address bits A0 to An and the outputs of fuse determining circuits 503A0 to 503An and an AND circuit 504c which inputs those outputs.

A redundant address is set by cutting fuses of fuse determining circuits 503A0 to 503An. The level of each of output signals FA0 to FAn of the fuse determining circuits 503A0 to 503An is in the H level when a corresponding fuse is cut, and the level of each of the output signals FA0 to FAn is in the L level when the corresponding fuse is not cut. Thus, the conductive states (the L level)/conductive state (the H level) states of the fuses of the fuse determining circuits 503A0 to 503An, and an address signal are compared and the comparing result is outputted from the XOR circuits 514A0 to 514An.

In order to confirm the operation of the redundancy decoder, it is supposed that there are four address bits A0 to A3 now and the fuses of the fuse determining circuits 3A0 to 3An are programmed in the states of ON, OFF, OFF and ON in order from the side of the address bit A0. Thus, the output signals FA0 to FA3 of the fuse determining circuits 503A0 to 503An becomes "0110". At this time, if the address bits A0 to A3 of "0110" are supplied, the outputs of the respective XOR circuits 514A0 to 514An are set to the H level, and the output of the AND circuit 504c is set to the H level. Thus, a redundant cell row is selected. If the address bits A0 to A3 with the other value is supplied, the output of either of the XOR 14A0 to 14An is set to the L level, and the redundant cell row is never selected. Thus, it can be confirmed that the redundant cell operates right.

In accordance with this conventional example, in order to check the fuse state corresponding to the address bit A0, an address of "1000" with the address bit A0 of the H level and the address bits A0 to A3 of the L level is supplied. In order to check the fuse state corresponding to the address bit A1, an address of "0100" with the address bit A1 of the H level and the address bits A0, A2 and A3 of the L level is supplied.

As described above, it is supposed that the fuses are programmed in the state of ON, OFF, OFF and ON in order from the address bit A0. At this time, when the address of "1000" is supplied to check the fuse corresponding to the address bit A0, the outputs of the XOR circuits 514A0 to 514An are set to "1110", and the output of an OR circuit 504d of the fuse detecting circuit is set to the H level. Next, when the address of "0100" is supplied to check the fuse corresponding to the address bit A1, the outputs of the XOR circuits 514A0 to 514An are set to "0010" and the output of the OR circuit 504d of the fuse detecting circuit is set to the H level.

In this example, the fuse corresponding to the address bit A0 is programmed to the ON state, the fuse corresponding to the address bit A1 is programmed to the OFF state. Although the states of the fuses are different, the output of the OR circuit 4d is set to the H level. From this fact, it could be understood that the state of each fuse cannot be checked.

The output of the AND circuit 504c of a defective address detecting circuit 504 is set to the H level only when the address bits A0 to An are supplied such that all the outputs of the XOR circuits 514A0 to 514An are set to the H level. Also, the output of the OR circuit 504d is set to the L level only when the address bits A0 to An are supplied such that all the outputs of the XOR circuits 514A0 to 514An are set to the L level.

This conventional technique cannot check each state of the fuse, whether the fuse is cut or not when a plurality of redundancy decoders exists. Also, when a fuse is erroneously programmed to the state that a redundancy decoder is not selected, the error cannot be detected. In the same way, when fuses are erroneously programmed to the state that redundancy decoders are selected, the error cannot be detected.

In conjunction with the above description, a semiconductor memory device is disclosed in Japanese Laid Open Patent application (JP-A-Heisei 4-205897). In this conventional example, the semiconductor memory device is composed of a main memory, a redundant memory, a route to transfer a signal from an input terminal to an internal circuit, and a sense circuit connected with the input terminal. A fuse and a transfer gate are provided for the end portion of the sense circuit. An end of the fuse is connected with a higher voltage or a ground voltage, and the fuse is cut based on an address for the redundant memory. The transfer gate is set to a conductive state or a non-conductive state in response to a control signal. The address for the redundant memory is sensed based on leakage current from the input terminal.

Also, a redundancy circuit using anti-fuse is disclosed in Japanese Laid Open Patent application (JP-P2002-133895A). In this conventional example, the redundancy circuit includes first and second electrical fuses whose characteristics are changed when a voltage higher than a predetermined level is applied. A differential amplifier receives two signal voltages depending on a difference between the first and second electrical fuses in characteristic, and amplifies the two signal voltages. A storage circuit stores the amplified signal voltages. A switch circuit connects the storage circuit with the differential amplifier and disconnects the storage circuit from the differential amplifier.

SUMMARY OF THE INVENTION

Therefore, an object of the present invention is to provide a redundancy circuit and a semiconductor device using the same, such as a semiconductor memory device, in which it is possible to determine whether or not data of a defective address is programmed in a specific fuse.

Also, another object of the present invention is to provide a redundancy circuit and a semiconductor device using the same, such as a semiconductor memory device, in which it is possible to determine to which of the redundancy decoders the data of the defective address is programmed.

In an aspect of the present invention, a redundancy control circuit includes a redundancy decoder and a decoder killer circuit. The redundancy decoder includes a plurality of fuse circuits corresponding to a plurality of determination signals which are previously activated, and each of the plurality of fuse circuits contains a plurality of fuse sections, and each of the fuse sections contains a fuse. The decoder killer circuit generates a killer signal when at least one of the plurality of determination signals is active, and the killer signal is outputted to an external unit in a first check mode. One of the plurality of fuse circuits is selected based on a first control signal and a first address bits of a first address in the first check mode, and the determination signals corresponding to the non-selected fuse circuits are inactivated. A specific one of the plurality of fuse sections of the selected fuse circuit inactivates the determination signal corresponding to the selected fuse circuit based on whether the fuse of the specific fuse section is cut in the first check mode, and each of the plurality of fuse sections of the selected fuse circuit other than the specific fuse section does not inactivate the determination signal.

Here, the redundancy decoder may further include a redundancy decoder address setting circuit which selects the specific fuse section of the selected fuse circuit based on second and third control signals and second address bits of a second address in the first check mode. In this case, the redundancy control circuit may further include a redundancy decoder selecting circuit which selects as the selected fuse circuit, one of the plurality of fuse circuits based on the first control signal and the fist address bits in the first check mode.

Also, each of the plurality of fuse sections may be provided for each of a true-side and a not-side to each of the second address bits, or each of the plurality of fuse sections may be provided for each of the second address bits.

Also, the redundancy control circuit may further include an address circuit which outputs the first address to the redundancy decoder selecting circuit and the second address to the redundancy decoder, while changing a bit position of a specific one among the second address bits. The specific second address bit corresponds to the specific fuse section, and a value of the specific second address bit of the second address bits is different from values of the other second address bits.

Also, the first address and the second address may be different from each other, or the first address bits may be part of the second address bits.

Also, the first control signal may contain the second and third control signals, or the first control signal may contain fourth and fifth control signals which are different from the second and third control signals.

Also, the redundancy decoder selecting circuit may include a plurality of selecting circuits provided for the plurality of fuse circuits. Preferably, one of the plurality of selecting circuits which is selected based on the first control signal and the first address bits keeps the corresponding determination signal active and selects the corresponding fuse circuit in the first check mode.

Also, the determination signals may be precharged up to a higher voltage. Each of the fuse sections may include the fuse, one end of which is grounded; and an N-channel transistor having a drain connected with the corresponding determination signal, a source connected with the other end of the fuse, and a gate connected with a signal obtained from one of the second address bits corresponding to the fuse section and the second and third control signals.

In this case, one of the plurality of fuse circuits is selected based on the second and third control signals and the second address bits in a second check mode. The determination signals corresponding to the non-selected fuse circuits are inactivated, and each of the plurality of selecting circuit selectively inactivates the corresponding determination signal based on the first control signal and the first address bits in the second check mode.

In another aspect of the present invention, a semiconductor memory device includes a memory cell array containing a plurality of memory cell rows; a row decoder which selects one of the plurality of memory cell rows based on a first part of a read address in an operation mode, the row decoder being disabled in response to a killer data; a redundancy cell array containing a plurality of redundancy memory cell rows, one of which is selected based on an active determination signal in the operation mode; and a column decoder which selects a memory cell of the selected memory cell row or the selected redundancy memory cell row based on a second part of the read address in the operation mode. The semiconductor memory device also includes an output section which outputs the killer data in response to a kill entry signal in a first check mode and outputs data from the selected memory cell in the operation mode; a decoder kill entry block which generates the kill entry signal in the first check mode; a test mode block which generates first to third control signals in the first check mode; and a redundancy control circuit which contains a redundancy decoder and a decoder killer circuit. The redundancy decoder includes a plurality of fuse circuits corresponding to a plurality of determination signals which are previously activated, and each of the plurality of fuse circuits contains a plurality of fuse sections, and each of the fuse sections contains a fuse. The decoder killer circuit generates the killer data when at least one of the plurality of determination signals is active. One of the plurality of fuse circuits is selected based on a first control signal and a first address bits of a first address in the first check mode, and the determination signals corresponding to the non-selected fuse circuits are inactivated. A specific one of the plurality of fuse sections of the selected fuse circuit inactivates the determination signal corresponding to the selected fuse circuit based on whether the fuse of the specific one is cut in the first check mode, and each of the plurality of fuse sections other than the specific fuse section does not inactivate the determination signal. The active determination signal is outputted from the redundancy decoder to the redundancy cell array.

Here, the redundancy decoder may further include a redundancy decoder address setting circuit selects the specific fuse section of the selected fuse circuit based on second and third control signals and second address bits of a second address in the first check mode. In this case, the redundancy control circuit may further include a redundancy decoder selecting circuit which selects as the selected fuse circuit, one of the plurality of fuse circuits based on the first control signal and the fist address bits in the first check mode.

Also, each of the plurality of fuse sections may be provided for each of a true-side and a not-side to each of the second address bits, or each of the plurality of fuse sections may be provided for each of the second address bits.

Also, the redundancy control circuit may further include an address circuit which outputs the first address to the redundancy decoder selecting circuit and the second address to the redundancy decoder, while changing a bit position of a specific one among the second address bits. The specific second address bit corresponds to the specific fuse section, and a value of the specific second address bit of the second address bits is different from values of the other second address bits.

Also, the first address and the second address may be different from each other, or the first address bits may be part of the second address bits.

Also, the first control signal may contain the second and third control signals, or the first control signal may contain fourth and fifth control signals which are different from the second and third control signals.

Also, the redundancy decoder selecting circuit may include a plurality of selecting circuits provided for the plurality of fuse circuits. Preferably, one of the plurality of selecting circuits which is selected based on the first control signal and the first address bits keeps the corresponding determination signal active and selects the corresponding fuse circuit in the first check mode.

Also, the determination signals may be precharged up to a higher voltage. Each of the fuse sections may include the fuse, one end of which is grounded; and an N-channel transistor having a drain connected with the corresponding determination signal, a source connected with the other end of the fuse, and a gate connected with a signal obtained from one of the second address bits corresponding to the fuse section and the second and third control signals.

In this case, one of the plurality of fuse circuits is selected based on the second and third control signals and the second address bits in a second check mode. The determination signals corresponding to the non-selected fuse circuits are inactivated, and each of the plurality of selecting circuit selectively inactivates the corresponding determination signal based on the first control signal and the first address bits in the second check mode.

BRIEF DESCRIPTION OF THE DRAWINGS

FIG. 6 is a diagram showing operation modes of a redundant control circuit in the semiconductor memory device according to the first embodiment of the present invention;

FIG. 9 is a diagram showing operation modes of the redundant control circuit of the semiconductor memory device according to the second embodiment of the present invention;

FIG. 17 is a diagram showing operation modes of the redundant control circuit in the semiconductor memory device according to the fourth embodiment of the present invention.

DESCRIPTION OF THE PREFERRED EMBODIMENTS

Hereinafter, a semiconductor memory device containing a redundancy circuit of the present invention will be described in detail with reference to the attached drawings.

Figure 1:
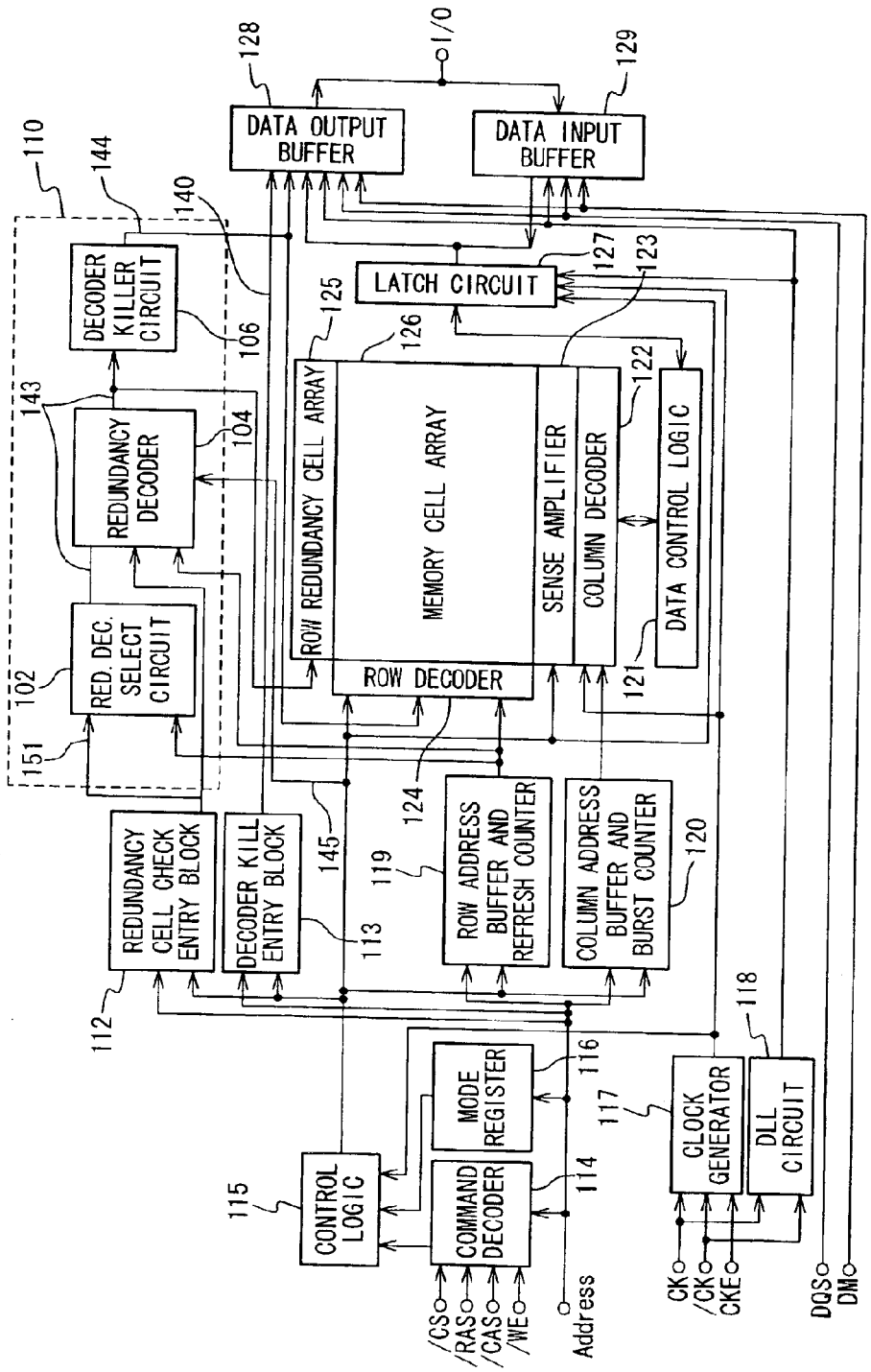
FIG. 1 is a block diagram showing the structure of a semiconductor memory device containing a redundancy circuit of a first conventional example.
Figure 2:
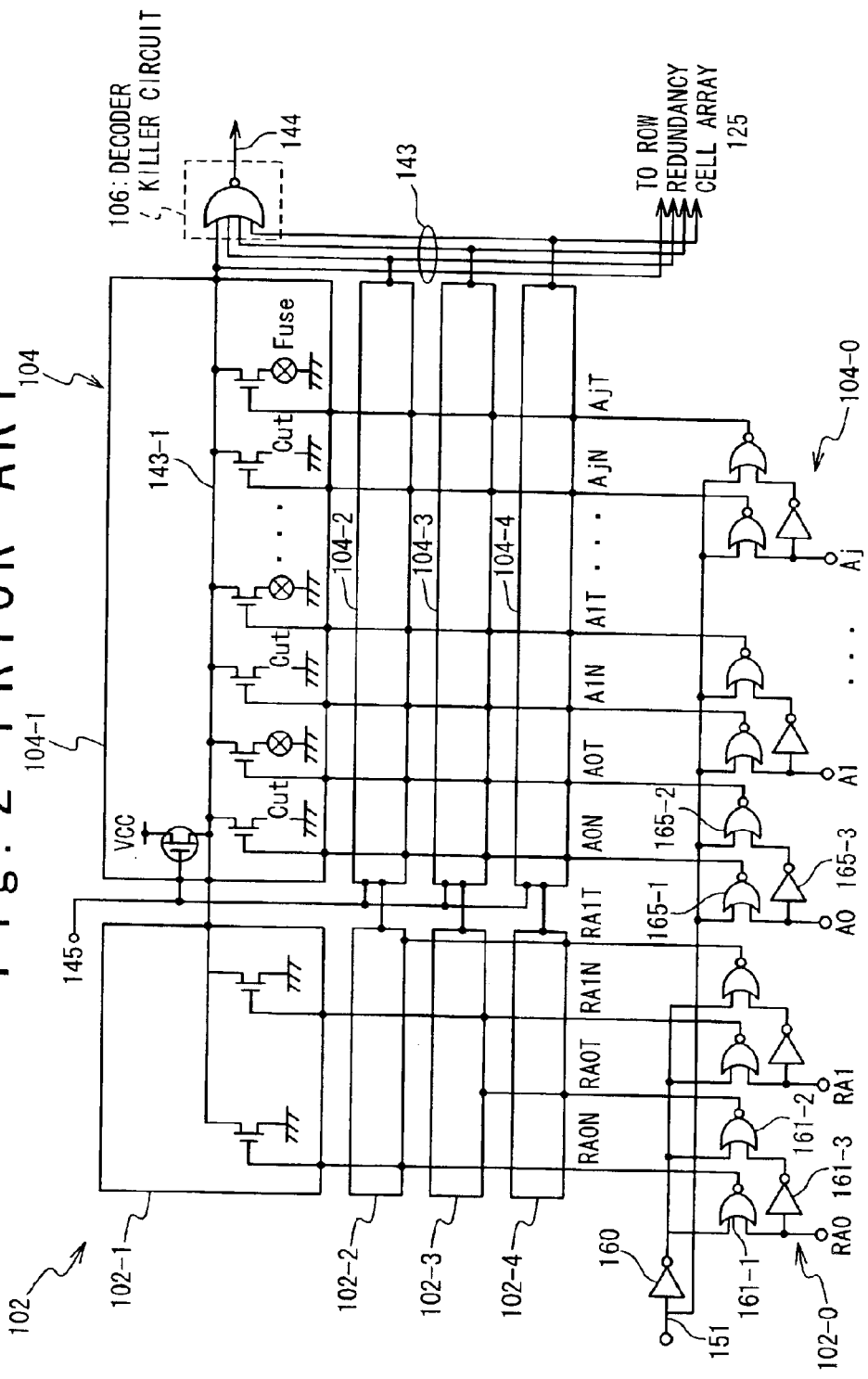
FIG. 2 is a circuit diagram showing the detailed structure of a redundancy control block in the first conventional example.
Figure 3:
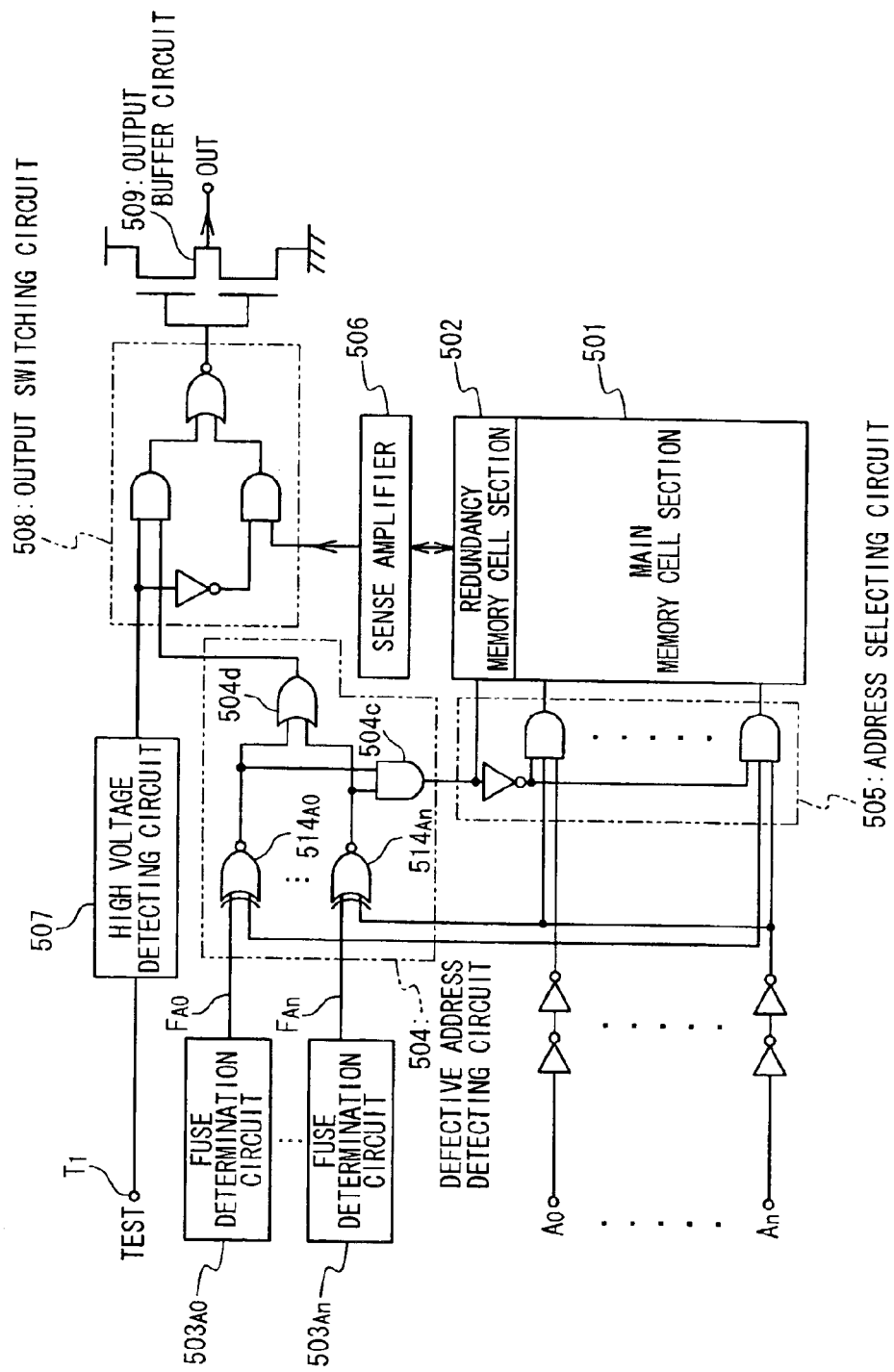
FIG. 3 is a block diagram showing the structure of a semiconductor memory device containing a redundancy circuit of a second conventional example.
Figure 4:
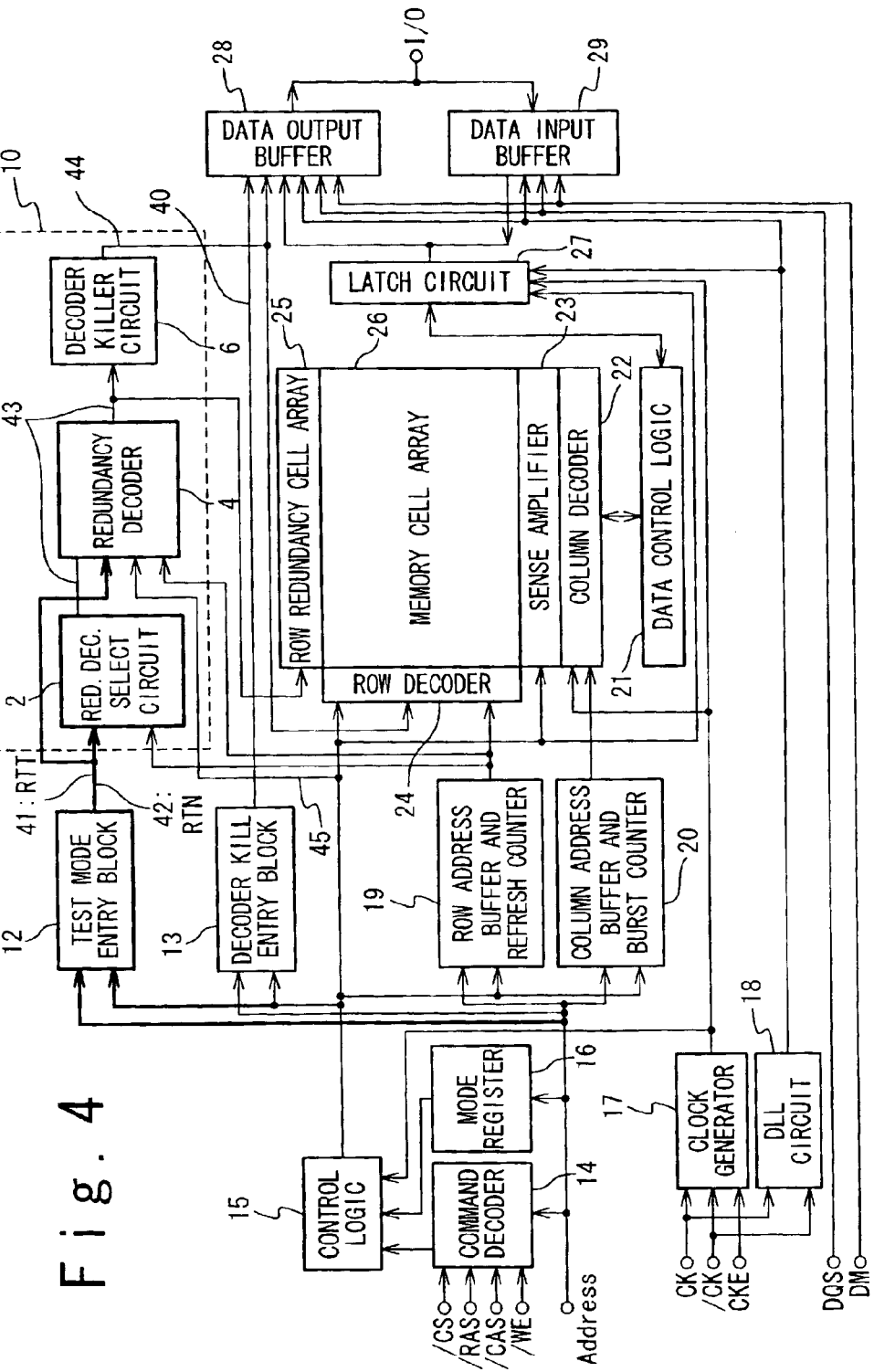
FIG. 4 is a block diagram showing the structure of a semiconductor memory device according to a first embodiment of the present invention.

FIG. 4 is a block diagram showing the structure of the semiconductor memory device according to the first embodiment of the present invention. Referring to FIG. 4, the semiconductor memory device is composed of a redundancy control circuit 10, a test mode entry block 12, a decoder kill entry block 13, a command decoder 14, a control logic circuit 15, a mode register 16, a clock generator 17, a DLL circuit 18, a row address buffer & refresh counter 19, a column address buffer & burst counter 20, a data control logic circuit 21, a column decoder 22, a sense amplifier 23, a row decoder 24, a row redundant cell array 25, a memory cell array 26, a latch circuit 27, a data output buffer 28, and a data input buffer 29.

An address is supplied to the test mode entry block 12, the decoder kill entry block 13, the command decoder 14, the mode register 16, the row address buffer & refresh counter 19, and the column address buffer & burst counter 20. The clock generator 17 receives clock signals CK and /CK, and a clock enable signal CKE and generates and supplies an internal clock signal to each section of the semiconductor memory device. The DLL circuit 18 receives the clock signals CK and /CK and outputs a sync signal to the latch circuit 27, the data output buffer 28, and the data input buffer 29. The command decoder 14 receives a chip select signal /CS, a row address strobe /RAS, a column address strobe /CAS, a write enable signal /WE and an address and outputs a decoding result to the control logic circuit 15. The mode register 16 receives the address, and sets and outputs an operation mode signal to the control logic circuit 15. The control logic 15 generates control signals in response to the internal clock signal from the clock generator 17 based on the output from the command decoder 14 and the output from the mode register 16. The control signals are supplied to the redundancy control circuit 10, the test mode entry block 12, the decoder kill entry block 13, the row address buffer & refresh counter 19, the column address buffer & burst counter 20, the sense amplifier 23, the low decoder 24, and the latch circuit 27. In this way, the operation of each section in the semiconductor memory device is controlled. It should be noted that the control signal supplied to the redundancy control circuit 10 is a precharge signal 45.

Here, the read/write operations without using a redundancy circuit will be described simply because they are well known.

An address is held in the row address buffer 19 and the column address buffer 20, and the row decoder 24 and the column decoder 22 specify an address of the memory cell array 26 based on the held address. In case of a read operation, data is read from the memory cell array 26 and is sensed by the sense amplifier 23 and is read out to an external device through the data control logic circuit 21, the latch circuit 27, and the data output buffer 28. Also, in case of a write operation, data is inputted to the data input buffer 29, is supplied to the sense amplifier 23 through the latch circuit 27, the data control logic circuit 21, is sensed by the sense amplifier 23 and is written in the specified address of the memory cell array 26.

Figure 5:
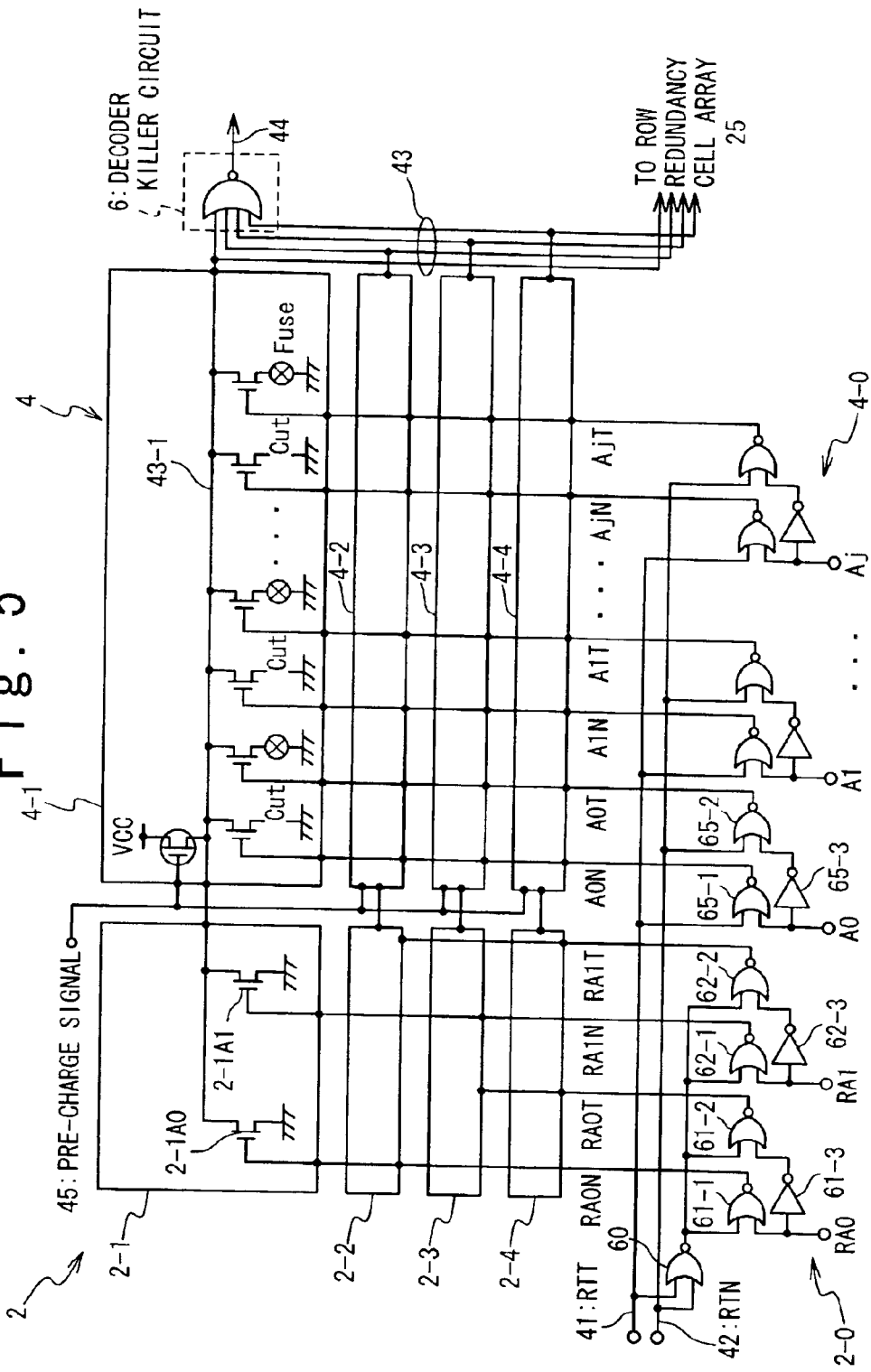
FIG. 5 is a block diagram showing the structure of a redundancy control circuit used in the semiconductor memory device according to the first embodiment of the present invention.

Next, the redundancy circuit which is related with the present invention will be described. Referring to FIG. 5, the redundancy control circuit 10 contains a redundancy decoder selecting circuit 2, a redundancy decoder 4, and a decoder killer circuit 6. In this example, the redundancy decoder selecting circuit 2 contains an address setting circuit 2-0 and selecting circuits 2-1, 2-2, 2-3, and 2-4. The redundancy decoder 4 contains an address setting circuit 4-0 and fuse circuits 4-1, 4-2, 4-3, and 4-4 corresponding to the redundancy decoder selecting circuit 2. Each of the fuse circuits has a plurality of fuse sections and each fuse section has a fuse. This fuse is cut and programmed previously dependent on the redundant operation. Therefore, in this specification, the fuse section functions as a program section, and a fuse section is sometimes referred to as a program section, and a fuse is sometimes referred to as a program element. The address setting circuit 2-0 and the address setting circuit 4-0 share a True test mode signal RTT 41 and a Not test mode signal RTN 42. Each of the selecting circuits 2-1, 2-2, 2-3, and 2-4 shares a redundancy determination signal 43 together with corresponding one of the fuse circuits 4-1, 4-2, 4-3, and 4-4. The control logic circuit 15 generates a test mode signal as the control signal based on the decoding result by the command decoder 14 and the mode signal from the mode register 16, and supplies it to the test mode entry block 12 and the decoder kill entry block 13. The test mode entry block 12 generates the True test mode signal RTT 41 and the Not test mode signal RTN 42 based on the test mode signal and the inputted address, and supplies them to the redundancy decoder selecting circuit 2 and the redundancy decoder 4. The decoder kill entry block 13 generates the decoder kill entry signal 40 based on the test mode entry signal and the inputted address and outputs it to the data output buffer 28. Also, the control logic circuit 15 supplies the precharge signal 45 to the redundancy decoder 4 as the control signal. The row address buffer & refreshment circuit 19 supplies an inputted address or the address which is generated inside, to the test mode entry block 12 and the decoder kill entry block 13. Thus, the redundancy decoder selecting circuit 2 selects one of the fuse circuits of the redundancy decoder 4 based on the True test mode signal RTT 41 and the Not test mode signal RTN 42. The redundancy decoder 4 determines whether the address is effective based on the True test mode signal RTT 41 and the Not test mode signal RTN 42, and outputs the redundancy determination signal 43 every the fuse circuit. The redundancy determination signals 43 are supplied to the row redundant cell array 25 and are used to specify a redundant cell row. Also, the redundancy determination signals 43 are supplied to the decoder killer circuit 6. The decoder killer circuit 6 generates the decoder killer signal 44 from the redundancy determination signals 43 and outputs it to the row decoder 24 and the data output buffer 28. The operation of the row decoder 24 is prohibited in response to the decoder killer signal 44. The data output buffer 28 outputs the decoder killer signal 44 in response to the decoder killer signal 44.

Next, the details of the circuit structure of the redundancy control circuit 10 will be described with reference to FIG. 5. As mentioned above, the redundancy decoder 4 contains the address setting circuit 4-0 and the fuse circuits 4-1, 4-2, 4-3, and 4-4. The True test mode signal RTT 41 and the Not test mode signal RTN 42 are supplied to the address setting circuit 4-0 and the address bits A0 to Aj are supplied. The fuse circuit sections 4-1, 4-2, 4-3, and 4-4 have the same circuit structure and are connected with the redundancy determination signals 43 (43-1, 43-2, 43-3, and 43-4) respectively. Therefore, the fuse circuit section 4-1 will be described.

The fuse circuit section 4-1 has a P-channel transistor. The source of the P-channel transistor is connected with the power supply voltage Vcc and the drain thereof is connected with the redundancy determination signal 43-1. The precharge signal 45 is supplied to the gate of the P-channel transistor from the control logic circuit 15. Also, the fuse circuit section 4-1 has a Not side fuse section and a True side fuse section to each of the address bits A0, . . . , Aj. Each of the Not side fuse section and the True side fuse section has the N-channel transistor and a fuse. The drain of the N-channel transistor is connected with the redundancy determination signal 43-1 and the source thereof is connected with the one end of the fuse. The other end of the fuse is grounded. The fuse is cut in accordance with a redundant address such that the fuse circuit 4-0 is programmed.

In the address setting circuit 4-0, the NOR circuit 65-1 is provided for the Not side of the address bit of A0. The address A0 is supplied to one of the input terminals of the NOR circuit 65-1 and the True test mode signal RTT 41 is supplied to the other input terminal. Also, the inverter 65-3 and the NOR circuit 65-2 are provided for the True side of the address bit of A0. The address bit A0 is supplied to one of the input terminals of the NOR circuit 65-2 through the inverter 65-3. The Not test mode signal RTT 42 is supplied to the other input terminal of the NOR circuit. The output of the NOR circuit 65-1 is connected to the gate of the N-channel transistor on the Not side of the fuse sections of the fuse circuits corresponding to the address bit A0. The output of the NOR circuit 65-2 is connected to the gate of the N-channel transistor on the True side of the fuse sections of the fuse circuit corresponding to the address bit A0. The same thing is true for the address bits A1 to Aj. Therefore, when the True test mode signal RTT 41 is in the H level, the output of the NOR circuit, e.g., NOR circuit 65-1 on the Not side of each address bit is set to the L level irrespective of the value of the address bit. In this way, the corresponding N-channel transistor in each fuse circuit is set to the OFF state. On the other hand, when the True test signal 41 is in the L level, the output of the NOR circuit, e.g., the NOR circuit 65-1 on the Not side of each address bit changes dependent on the value of the address bit. Therefore, the corresponding N-channel transistor in each fuse circuit is set to the ON/OFF state in accordance with the corresponding address bit. Also, when the Not test mode signal RTN 42 is in the H level, the output of the NOR circuit, e.g., the NOR circuit 65-2 on the True side of each address bit is set to the L level irrespective of the value of the address bit. Therefore, the corresponding N-channel transistor in each fuse circuit is set to the OFF state. On the other hand, when the True test mode signal 41 is in the L level, the output of the NOR circuit, e.g., the NOR circuit 65-2 on the True side of each address bit changes dependent on the value of the address bit. Therefore, the corresponding N-channel transistor in the fuse circuit is set to the ON/OFF state in accordance with the corresponding address bit.

The selecting circuits 2-1, 2-2, 2-3, and 2-4 have the same circuit structure. Therefore, only the selecting circuit 2-1 will be described. The selecting circuit 2-1 has two N-channel transistors 2-1A0 and 2-1A1. The drain of each N-channel transistor is connected with the redundancy determination signal 43-1 and the source thereof is grounded. In the address setting circuit 2-0, a NOR circuit 60 is connected with the True test mode signal RTT 41 and the Not test mode signal RTN 42. The NOR circuit 61-1 is provided to the NOR circuit 60 and the Not side of the address of RA0. The address bit RA0 is supplied to one of the input terminals of the NOR circuit 61-1 and the output of the NOR circuit 60 is supplied to the other input terminal. Also, the inverter 61-3 and the NOR circuit 61-2 are provided to the True side of the address bit of RA0. The address bit RA0 is supplied to one of the input terminals of the NOR circuit 61-2 through the inverter 61-3. The output of the NOR circuit 60 is supplied to the other input terminal of the NOR circuit 61-2. The same is true to the NOR circuit 62-1 and the inverter 62-3 for the address bit RA1. The output of the NOR circuit 61-1 is supplied to the gates of the N-channel transistors 2-1A0 and 2-2A0 of the selecting circuits 2-1 and 2-2. The output of the NOR circuit 61-2 is supplied to the gates of the N-channel transistors 2-3A0 and 2-4A0 of the selecting circuits 2-3 and 2-4. The output of the NOR circuit 62-1 is supplied to the gates of the N-channel transistors 2-1A1 and 2-3A1 of the selecting circuits 2-1 and 2-3. The output of the NOR circuit 62-2 is supplied to the gate of the other N-channel transistors 2-2A1 and 2-4A1 of the selecting circuits 2-2 and 2-4. Therefore, when both of the True test mode signal RTT 41 and the Not test mode signal RTN 42 are in the L level, the output of the NOR circuit 60 is set to the H level, and the output of each of the NOR circuits 61-1, 61-2, 62-1 and 62-2 is set to the L level irrespective of the value of the address bit. Therefore, the corresponding N-channel transistor in each selecting circuit is set to the OFF state. Thus, the redundancy decoder selecting circuit 2 does not have an influence on the redundancy decoder 4. On the other hand, when one of the True test mode signal RTT 41 and the Not test mode signals RTN 42 is in the H level, the output of the NOR circuit 60 is set to the L level, and the output of each of the NOR circuits 61-1, 61-2, 62-1 and 62-2 changes dependent on the value of the address bit. Therefore, the corresponding N-channel transistor in each selecting circuit is set to the ON/OFF state in accordance with the corresponding address bit. The decoder killer circuit 6 has the NOR circuit which inputs the redundancy determination signals 43-1, 43-2, 43-3, 43-4 and generates the decoder killer signal 44.

It should be noted that the address bits RA0 and RA1 supplied to the redundancy decoder selecting circuit 2 are different from the redundant address bits A0 to Aj supplied to the redundancy decoder 4 and are supplied in parallel to the redundant address bits A0 to Aj.

Next, the operation mode of the redundant control of the semiconductor memory device according to the first embodiment of the present invention will be described with reference to FIG. 6.

There are four modes in the redundant control of the semiconductor memory device according to the first embodiment of the present invention. That is, they are the normal mode, the redundant cell check test mode, the roll call test mode, and a fuse check test mode.

(1) In the normal mode, access to the row redundant cell array 25 is carried out. Therefore, the decoder kill entry signal 40 from the decoder kill entry block 13 is in the L level and the True test mode signal RTT 41 from the test mode entry block 12 and the Not test mode signal RTN 42 are set to the L level.

(2) In the redundant cell check test mode, whether or not the row redundant cell array 25 is normal is determined. Therefore, the decoder kill entry signal 40 from the decoder kill entry block 13 is in the L level and the True test mode signal RTT 41 from the test mode entry block 12 and the Not test mode signal RTN 42 are both set to the H level.

(3) In the roll call test mode, whether the redundant address is correctly programmed in which of the fuse circuits 4-1, 4-2, 4-3, and 4-4 of the redundancy decoder 4 is checked. Therefore, the decoder kill entry signal 40 from the decoder kill entry block 13 is in the in the H level and the True test mode signal RTT 41 and the Not test mode signal RTN 42 from the test mode entry block 12 are both set to the L level.

(4) In the fuse check test mode, whether each fuse of each fuse section of each of the fuse circuits 4-1, 4-2, 4-3, and 4-4 of the redundancy decoder 4 is programmed or cut in accordance the redundant address is tested. Therefore, the decoder kill entry signal 40 from the decoder kill entry block 13 is in the H level and one of the True test mode signal RTT 41 and the Not test mode signal RTN 42 from the test mode entry block 12 is set to the H level.

The operations in the above-mentioned four modes will be described in detail below. In either of the four operation modes, the precharge signal 45 of the L level is first supplied from the control logic circuit 15 to the redundancy decoder 4 in a pulse as the control signal. Each P-channel transistor of the fuse circuits 4-1, 4-2, 4-3, and 4-4 is set to the ON state. Thus, the redundancy determination signal 43-1, 43-2, 43-3, 43-4 corresponding to the fuse circuits 4-1, 4-2, 4-3, and 4-4 are set to the power supply voltage Vcc (the H level).

First, (1) the normal mode will be described. The test mode entry block 12 outputs the True test mode signal RTT 41 and the Not test mode signal RTN 42, which are both in the L level, based on the control signal from the control logic circuit 15 and the inputted address. Also, the decoder kill entry block 13 outputs the decoder kill entry signal 40 of the L level based on the control signal from the control logic circuit 15 and the inputted address. Therefore, the output of the NOR circuit 60 of the address setting circuit 2-0 of the redundancy decoder selecting circuit 2 is set to the H level, and all the output of the NOR circuits 61-1, 61-2, 62-1 and 62-2 of the address setting circuit 2-0 are set to the L level. As the result, all the N-channel transistors of the selecting circuits 2-1, 2-2, 2-3, and 2-4 are set to the OFF state and the redundancy decoder selecting circuit 2 is set to the disable state. Therefore, the selecting circuits 2-1, 2-2, 2-3, and 2-4 do not have an influence on the redundancy determination signals 43 and also the redundancy decoder selecting circuit 2 does not have an influence on the selection of the fuse circuit.

In the address setting circuit 4-0 of the redundancy decoder 4, all the NOR circuits are active and the outputs of the NOR circuits change in accordance with the address bits A0 to Aj supplied from the row address buffer 19. Generally, the fuses are cut in accordance with the inputted address bits A0 to Aj. However, in case that all the fuses are not yet cut, either of the redundancy determination signals 43-1, 43-2, 43-3, and 43-4 of the fuse circuits 4-1, 4-2, 4-3, and 4-4 is set to the L level, because a signal of the Not side and a signal of the True side are supplied and one of the transistors is always turned on based on the address bits A0 to Aj. The redundancy determination signals 43 (43-1, 43-2, 43-3, and 43-4) are outputted to the row redundant cell array 25 and the decoder killer circuit 6. The row redundant cell array 25 ignores all the redundancy determination signals 43 of the L level. The decoder killer circuit 6 generates the decoder killer signal 44 of the H level from the redundancy determination signals 43 of the L level and outputs it to the row decoder 24 and the data output buffer 28. Because the decoder kill entry signal 40 of the L level is outputted from the decoder kill entry block 13 at this time, the decoder killer signal 44 is never outputted from the data output buffer 28. Also, when the decoder killer signal 44 is in the H level, the row decoder 24 operates normally. Thus, the read/write operation is carried out normally through the sense amplifier 23, the data control logic circuit 21, the latch circuit 27, the data output buffer 28, and the data input buffer 29 using the memory cell array 26. On the other hand, when either of the redundancy determination signals 43-1, 43-2, 43-3, and 43-4 of the fuse circuits 4-1, 4-2, 4-3, and 4-4 is set to the H level based on the address bits A0 to Aj, the decoder killer circuit 6 generates and outputs the decoder killer signal 44 of the L level to the row decoder 24 and the data output buffer 28. Because the decoder kill entry signal 40 of the L level is outputted from the decoder kill entry block 13 at this time, the decoder killer signal 44 is never outputted from the data output buffer 28. Also, the row decoder 24 is set to the disable state in response to the decoder killer signal 44 of the L level and stops the operation. Therefore, the memory cell array 26 is never used. Also, the redundancy determination signals 43-1, 43-2, 43-3, 43-4 are supplied to the row redundant cell array 25 and one redundant cell row of the row redundant cell array 25 is selected. The read/write operation is carried out through the sense amplifier 23, the data control logic circuit 21, the latch circuit 27, the data output buffer 28, and the data input buffer 29 to the selected redundant cell row. It should be noted that the column address buffer 20 and the column decoder 22 are used according to necessity. In this way, data necessary to the selected redundant cell row is selected.

Next, the operation in (2) the redundant cell check test mode will be described. In the redundant cell check test mode, the test mode entry block 12 outputs the True test mode signal RTT 41 and the Not test mode signal RTN 42, which are both in the H level, based on the control signal from the control logic circuit 15 and the address. Also, the decoder kill entry block 13 outputs the decoder kill entry signal 40 of the L level based on the control signal from the control logic circuit 15 and the address. Because the True test mode signal RTT 41 and the Not test mode signal RTN 42 are both in the H level, the output of the NOR circuit 60 of the address setting circuit 2-0 of the redundancy decoder selecting circuit 2 is set to the L level. The outputs of the NOR circuits 61-1 61-2, 62-1, and 62-2 of the address setting circuits 2-0 are determined based on the address bits RA0 and RA1. As a result, one of the redundancy determination signals 43-1, 43-2, 43-3 and 43-4 of the selecting circuits 2-1, 2-2, 2-3, and 2-4 is set to the H level based on the address bits RA0 and RA1, and the other signals are set to the L level.

On the other hand, because the True test mode signal RTT 41 and the Not test mode signal RTN 42 are both in the H level, the outputs of all the NOR circuits are set to the L level in the address setting circuit 4-0 of the redundancy decoder 4. Therefore, all the N-channel transistors in the fuse circuits 4-1, 4-2, 4-3, and 4-4 are set to the OFF state and the redundancy decoder 4 does not have an influence on the redundancy determination signals 43. The redundancy determination signals 43 (43-1, 43-2, 43-3, and 43-4) are outputted to the row redundant cell array 25 and the decoder killer circuit 6. Because one of the redundancy determination signals 43 is in the H level, the decoder killer circuit 6 generates the decoder killer signal 44 of the L level and the redundancy determination signal 43 of the H level is outputted to the row decoder 24 and the data output buffer 28. Because the decoder kill entry signal 40 of the L level is outputted from the decoder kill entry block 13 at this time, the decoder killer signal 44 is never outputted from the data output buffer 28. Also, when the decoder killer signal 44 is in the L level, the row decoder 24 is set to the disable state in response to the decoder killer signal 44 of the L level and stops the operation. Therefore, the memory cell array 26 is never used. Also, the redundancy determination signals 43-1, 43-2, 43-3, and 43-4 are supplied to the row redundant cell array 25 and one of redundant cell rows in the row redundant cell array 25 corresponding to the redundancy determination signal 43 of the H level is selected. The read/write operation is carried out through the sense amplifier 23, the data control logic circuit 21, the latch circuit 27, the data output buffer 28, and the data input buffer 29 to the selected redundant cell row. At this time, if the address bits RA0 and RA1 supplied from the row address buffer 19 are changed in order, the data can be read through the data output buffer 28 in the order from the redundant cell of the redundant cell row of the row redundant cell array 25. The state of each memory cell of redundant cell row can be checked.

The selecting circuit address bits RA0 and RA1 supplied to the redundant selection decoder 2 are different from the redundant address bits A0 to Aj supplied to the redundancy decoder 4 and are supplied in parallel to the redundant address bits A0 to Aj.

Next, the operation in the (3) roll call test mode will be described. In the roll call test mode, the test mode entry block 12 outputs the True test mode signal RTT 41 and the Not test mode signal RTN 42, which are both in the L level, based on the control signal from the control logic circuit 15 and the address. Also, the decoder kill entry block 13 outputs the decoder kill entry signal 40 of the H level to the data output buffer 28 based on the control signal from the control logic circuit 15 and the address. Therefore, the output of the NOR circuit 60 of the address setting circuit 2-0 of the redundancy decoder selecting circuit 2 is set to the H level, all the output of the NOR circuits 61-1, 61-2, 62-1 and 62-2 of the address setting circuit 2-0 are set to the L level. As a result, all the N-channel transistors of the selecting circuits 2-1, 2-2, 2-3, and 2-4 are set to the OFF state and the redundancy decoder selecting circuit 2 is set to disable state. Therefore, the selecting circuits 2-1, 2-2, 2-3, and 2-4 do not have an influence on the redundancy determination signal 43 and also the redundancy decoder selecting circuit 2 does not have an influence on the selection of the fuse circuit of the redundancy decoder 4.

On the other hand, in the address setting circuit 4-0 of the redundancy decoder 4, all the NOR circuits are active and the outputs of the NOR circuits change in accordance with the address bits A0 to Aj supplied from the row address buffer 19. When a fuse circuit exists in which fuses are cut in accordance with the inputted address bits A0 to Aj, either of the redundancy determination signal 43-1, 43-2, 43-3, 43-4 of the fuse circuits 4-1, 4-2, 4-3, and 4-4 is set to the H level based on the address bits A0 to Aj. In this case, the redundancy determination signals 43-1, 43-2, 43-3, 43-4 are outputted to the decoder killer circuit 6 and the row redundant cell array 25. The decoder killer circuit 6 generates and outputs the decoder killer signal 44 of the L level to the row decoder 24 and the data output buffer 28. Because the decoder kill entry signal 40 of the H level is outputted from the decoder kill entry block 13 at this time, the decoder killer signal 44 is outputted to the data output buffer 28. Also, the row decoder 24 is set to the disable state in response to the decoder killer signal 44 of the L level and stops the operation. Therefore, the memory cell array 26 is never used. Also, the redundancy determination signals 43-1, 43-2, 43-3, 43-4 are supplied to the row redundant cell array 25 and one of the redundant cell rows in the row redundant cell array 25 corresponding to the redundancy determination signal of the H level is selected. Even if data is supposed to have been read through the sense amplifier 23, the data control logic circuit 21, and the latch circuit 27 from the selected redundant cell row, the data from redundant cell row is never outputted from the data output buffer 28 because the decoder kill entry signal 40 is in the H level. Therefore, it is possible to determine whether or not the address bits A0 to Aj are used for the redundant operation. Also, if the address bits A0 to Aj outputted from the row address buffer 19 are changed in order, addresses which use the row redundant cell array 25 can be known.

Next, the operation in the (4) fuse check test will be described. In the fuse check test mode, the test mode entry block 12 outputs the True test mode signal RTT 41 and the Not test mode signal RTN 42, one of which is in the H level and the other is in the L level, based on the control signal from the control logic circuit 15 and the address. In the following example, it is supposed that the True test mode signal RTT 41 is in the H level and the Not test mode signal RTN 42 is the L level. Also, the decoder kill entry block 13 outputs the decoder kill entry signal 40 of the H level to the data output buffer 28 based on the control signal from the control logic circuit 15 and the address. Thus, the data output buffer 28 outputs not data from the latch circuit 27 but the decoder killer signal 44 from the decoder killer circuit 6.

In this example, because the True test mode signal RTT 41 is in the H level, the output of the NOR circuit 60 of the address setting circuit 2-0 of the redundancy decoder selecting circuit 2 is set to the L level. The output of each of the NOR circuit 61-1, 61-2, 62-1, and 62-2 of the address setting circuit 2-0 is determined based on the address bits RA0 and RA1. As a result, one of the redundancy determination signals 43-1, 43-2, 43-3 and 43-4 of the selecting circuits 2-1, 2-2, 2-3, and 2-4 is set to the H level based on the address bits RA0 and RA1, and all the other ones are set to the L level. That is, the selecting circuits corresponding to the redundancy determination signals of the L level are set to the disable state (non-selected state) and only the fuse circuit corresponding to the redundancy determination signal of the H level is made effective.

On the other hand, because the True test mode signal RTT 41 is in the H level, the output of the NOR circuit on the Not side, i.e., the NOR circuit 65-1 and the output of the NOR circuit corresponding to it are set to the L level in the address setting circuit 4-0 of the redundancy decoder 4. Therefore, all the N-channel transistors on the Not side of the fuse circuits 4-1, 4-2, 4-3, and 4-4 are set to the OFF state. On the other hand, because the Not test mode signal RTN 42 is in the L level, the output of the NOR circuit on the True side, i.e., the NOR circuit 65-2 and the output of the NOR circuit corresponding to it are determined based on the address bits A0 to Aj in the address setting circuit 4-0 of the redundancy decoder 4. Therefore, all the N-channel transistors on the True side of one corresponding to the redundancy determination signal of the H level in the fuse circuits 4-1, 4-2, 4-3, and 4-4 can are set to the ON/OFF state dependent on the address bits A0 to Aj. Therefore, for example, by supplying specific address bits RA0 and RA1 to the address setting circuit 2-0, the selecting circuit 2-1 can be selected. At this time, only the redundancy determination signal 43-1 is in the H level and the redundancy determination signals 43-2, 43-3, 43-4 are all set to the L level. Therefore, in the redundancy decoder 4, the fuse circuits 4-2, 4-3, and 4-4 do not have an influence on the redundancy determination signals 43. Because the True test mode signal RTT 41 is in the H level in the fuse circuit 4-1, the N-channel transistor on the Not side does not have an influence on the redundancy determination signals 43. If the fuse on the True side has been cut right when the address bits A0 to Aj are given in this condition, the redundancy determination signal 43-1 is set to the H level. The redundancy determination signals 43 are supplied to the decoder killer circuit 6, and the decoder killer circuit 6 generates and outputs the decoder killer signal 44 of the L level to the data output buffer 28. Because the decoder kill entry signal 40 of the H level is outputted to the data output buffer 28 from the decoder kill entry block 13 at this time, the decoder killer signal 44 of the L level is outputted from the data output buffer 28 to the external unit. In this way, the cutting state of the fuse of the fuse circuit 4-1 on the True side can be checked. However, because the plurality of sets of the N-channel transistor and the fuse on the True side are provided in parallel in the fuse circuit 4-1, the redundancy determination signal 43 of the fuse circuit 4-1 is set to the L level when the fuse of one of the plurality of sets is not yet cut and the gate of the N-channel transistor of the set is set to the H level. Also, the output can be set with no relation to the cut/non-cut state of the fuse by setting the gates of the N-channel transistors to the L level. Therefore, if the above-mentioned operation is carried out while the address bits A0 to Aj supplied from the row address buffer 19 is changed, it can know whether the fuse on the True side corresponding to each address bit is cut correctly in the fuse circuit 4-1. For example, it is supposed that the address bits A0 to Aj are supplied from the row address buffer 19 and only the address bit A0 is in the H level and all the address bits A1 to Aj are in the L level. In this case, because only the output of the NOR circuit corresponding to the address bit A0 on the True side is set to the H level, only the N-channel transistor in the fuse section corresponding to the True side of the address bit A0 in the fuse circuit is set to the ON state. The other N-channel transistors are set to the OFF state. Therefore, if the fuse of the fuse section corresponding to the True side of the address bit A0 is cut correctly, the redundancy determination signal 43-1 holds the H level, and if the fuse is not cut, the redundancy determination signal 43-1 is set to the L level. The redundancy determination signal 43 is outputted to the decoder killer circuit 6 and a determination result is outputted from the data output buffer 28.

Next, the cutting state of the fuse corresponding to the bit True side of the address bit A1 can be known, when the H level is transferred to the address bit A1 and the other address bits are set to the L level. In this way, by changing the address bit of the H level in order, the cutting state of the each fuse on the True side in the fuse circuit 4-1 can be known. Also, in order to check the cutting state of each fuse of the fuse circuit 4-1 on the Not side, it should carry out a similar test operation, by setting the Not test mode signal to the H level, the True test mode signal RTT 41 to the L level. At this time, as the address bits, only one of the address bits A0 to Aj is the L level and the other address bits are set to the H level.

Moreover, when each of the fuse circuits 4-2, 4-3, and 4-4 is tested, the address bits RA0 and RA1 are changed to specify one of the fuse circuits 4-2, 4-3, and 4-4 and the same test operation as the above may be carried out.

In this way, the cutting state of each fuse on the True side or the Not side of each fuse circuit in the redundancy decoder 4 can be known.

In the semiconductor memory device containing the conventional redundancy circuit, it cannot be checked whether or not each fuse of each fuse section of the fuse circuit is cut correctly. However, in the present invention, the cut state of each fuse can be known without increasing a circuit scale substantially, comparing with the conventional redundancy circuit. For this purpose, the two control signals are supplied from the test mode entry block 12 to the redundancy decoder 4. Thus, it is possible to check whether each fuse of each fuse section of each fuse circuit is cut correctly, separating the Not side and the True side.

Next, the semiconductor memory device with the redundancy circuit according to the second embodiment of the present invention will be described with reference to FIGS. 7 to 9. In the semiconductor memory device with the redundancy circuit according to the second embodiment, a mode to check the position of a redundant cell and an address corresponding to the redundant cell is added. The same component as those of FIG. 6 are allocated with the same reference numerals as those of FIG. 4 and the detailed description will be omitted.

Figure 7:
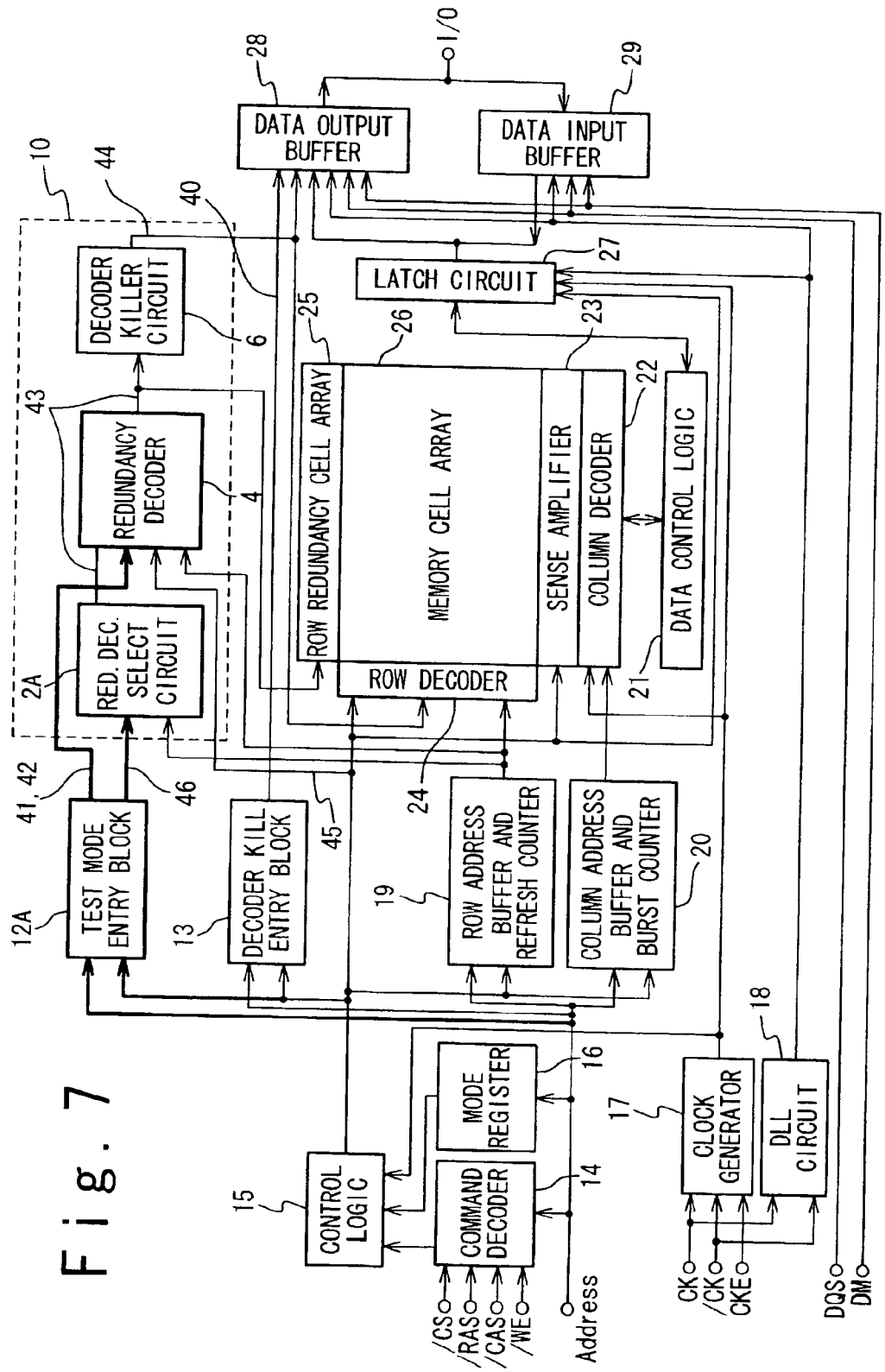
FIG. 7 is a block diagram showing the structure of the semiconductor memory device according to a second embodiment of the present invention.

Referring to FIG. 7, the second embodiment is different from the first embodiment in the point that the test mode entry block 12A generates a test mode signal TSEL 46 in addition to the True test mode signal RTT 41 and the Not test mode signal RTN 42. The test mode signal TSEL 46 is outputted by the redundancy decoder selecting circuit 2A but is not supplied to the redundancy decoder 4. On the other hand, the True test mode signal RTT 41 and the Not test mode signal RTN 42 are not outputted to the redundancy decoder selecting circuit 2A but are supplied to the redundancy decoder 4. The second embodiment is the same as the first embodiment in the other structure.

Figure 8:
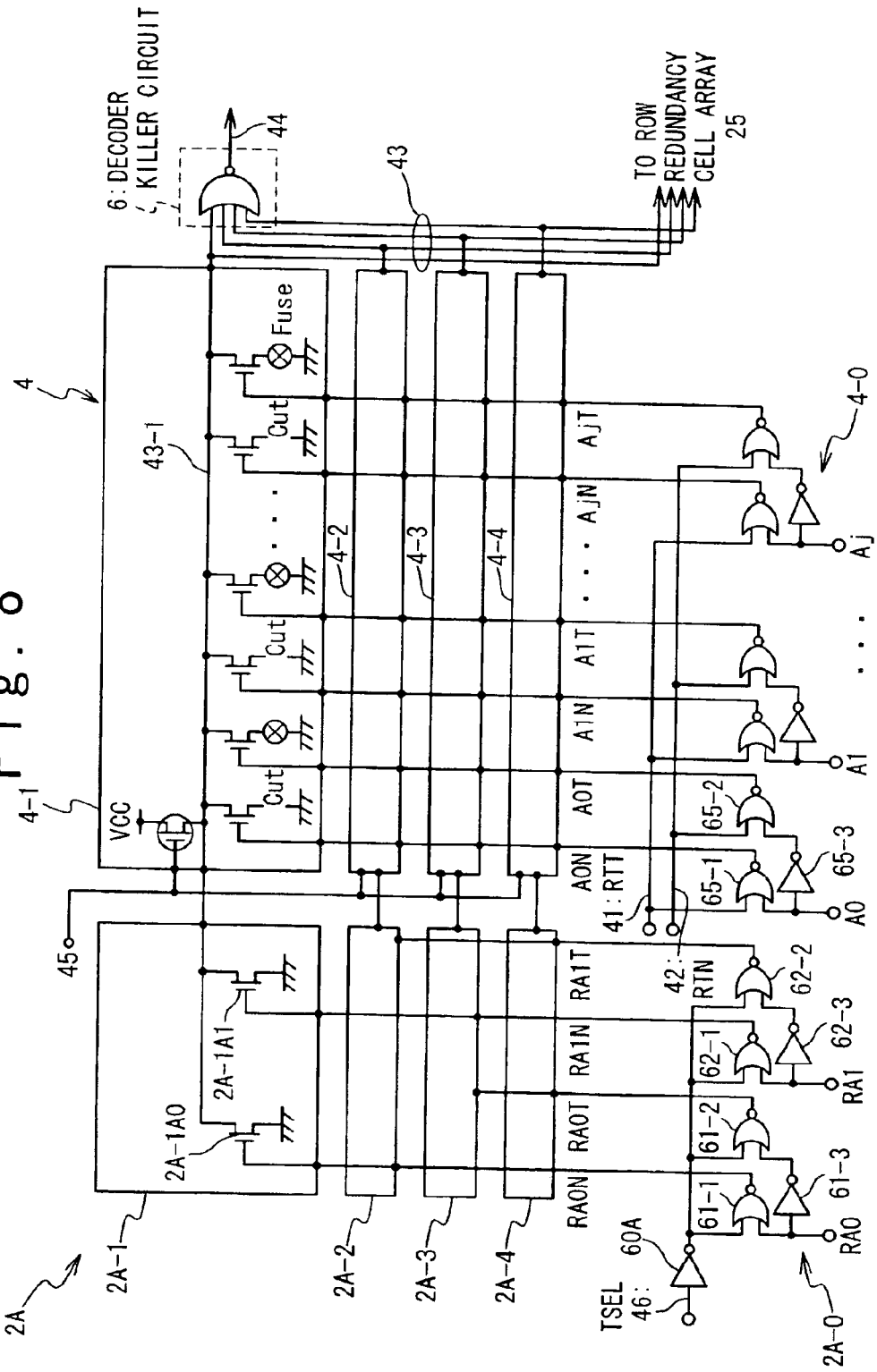
FIG. 8 is a block diagram showing the structure of the redundancy control circuit used in the semiconductor memory device according to the second embodiment of the present invention.

FIG. 8 shows the detail of the redundancy decoder selecting circuit 2A, the redundancy decoder 4, and the decoder killer circuit 6. Referring to FIG. 8, the redundancy decoder selecting circuit 2A contains the address setting circuit 2A-0 and the selecting circuits 2A-1, 2A-2, 2A-3 and 2A-4. The address setting circuit 2A-0 in the second embodiment is different from the address setting circuit 2-0 in the first embodiment in that the inverter 60A which receives the test mode signal TSEL 46 is used in place of the NOR circuit 60 which receives the True test mode signal RTT 41 and the Not test mode signal RTN 42. That the test mode signal TSEL 46 of the H level is supplied to the inverter 60A in the second embodiment is equivalent to that the True test mode signal RTT 41 and the Not test mode signal RTN 42, at least one of which is in the H level in the first embodiment, are supplied to the NOR circuit 60. Also, that the test mode signal TSEL 46 of the L level is supplied to the inverter 60A in the second embodiment is equivalent to that the True test mode signal RTT 41 and the Not test mode signal RTN 42 which are both in the L level in the first embodiment are supplied to the NOR circuit 60. The operation of the redundancy decoder selecting circuit 2A could be understood to a person in the art from the above description. Therefore, the detailed description of the redundancy decoder selecting circuit 2A will be omitted.

In the semiconductor memory device according to the second embodiment of the present invention, in addition to the four operation modes in the first embodiment, that is, (1) the normal mode, (2) the redundant cell check test mode, (3) the roll call test mode, and (4) the fuse check test mode, (5) a fuse reverse check test mode is provided. Although the fuse cut/non-cut state is detected every fuse in the fuse check test mode (4), in the (5) fuse reverse check test mode, which of the fuse circuits corresponds to address bits A0 to Aj is detected. Because the operation modes (1) to (4) are same as those in the first embodiment, the detailed description will be omitted.

(5) The fuse reverse check test mode will be described in detail below. The test mode entry block 12A outputs the test mode signal TSEL 46 of the H level, and the True test mode signal RTT 41 and the Not test mode signal RTN 42, which are both in the L level, based on the control signal from the control logic circuit 15 and the inputted address. Also, the decoder kill entry block 13 outputs the decoder kill entry signal 40 of the H level to the data output buffer 28 based on the control signal from the control logic circuit 15 and the inputted address. When the decoder kill entry signal 40 is in the L level, the data output buffer 28 outputs data from the latch circuit 27. When the decoder kill entry signal 40 is in the H level, the data output buffer 28 outputs the decoder killer signal 44 from the decoder killer circuit 6. Therefore, the output of the inverter 60A of the address setting circuit 2A-0 of the redundancy decoder selecting circuit 2A is set to the L level, the outputs of all the NOR circuits 61-1, 61-2, 62-1 and 62-2 of the address setting circuit 2A-0 depend on the address bits RA0 and RA1. As a result, one of the selecting circuits 2A-1, 2A-2, 2A-3 and 2A-4 is set to an enable state depending on the address bits RA0 and RA1. That is, one of the redundancy determination signals 43 from the selecting circuits 2A-1, 2A-2, 2A-3 and 2A-4 is set to the H level and the other signals are set to the L level.

Because the True test mode signal RTT 41 and the Not test mode signal RTN 42 are both in the L level, all the NOR circuits are active in the address setting circuit 4-0 of the redundancy decoder 4, and the outputs of the NOR circuits are determined in accordance with the address bits A0 to Aj supplied from the row address buffer 19. If the fuse of the fuse circuit of the redundancy decoder 4 corresponding to the selecting circuit in the redundancy decoder selecting circuit 2A which is specified based on the address bits RA0 and RA1 has been cut in correspondence to the address bits A0 to Aj, the redundancy determination signal 43 is set to in the H level based on the address bits A0 to Aj. The redundancy determination signal 43 of the H level is outputted to the decoder killer circuit 6 and the row redundant cell array 25. The decoder killer circuit 6 generates and outputs the decoder killer signal 44 of the L level to the row decoder 24 and the data output buffer 28. Because the decoder kill entry signal 40 of the H level is outputted from the decoder kill entry block 13 at this time, the decoder killer signal 44 is outputted from the data output buffer 28. The position of the redundant cell row corresponding to the address bits A0 to Aj and the corresponding selecting circuit and fuse circuit can be known from this output and the address bits RA0 and RA1.

In this case, when the output from the data output buffer 28 is not in the L level, the position of the redundant cell row corresponding to the address bits A0 to Aj, and the corresponding selecting circuit and the fuse circuit can be known by outputting the address bits RA0 and RA1 from the row address buffer 19 to the address setting circuit 2A-0 while changing the address bits RA0 and RA1 in order.

In the conventional semiconductor memory device with the redundancy circuit, the address corresponding to the position of the redundant cell row could not be checked. However, in the semiconductor memory device with the redundancy circuit according to the second embodiment, the (5) fuse reverse check test mode can be added to check the address corresponding to the redundant cell row, in addition to the (4) fuse check test mode without increasing a circuit structure substantially from the conventional semiconductor memory device with the redundancy circuit.

Figure 10:
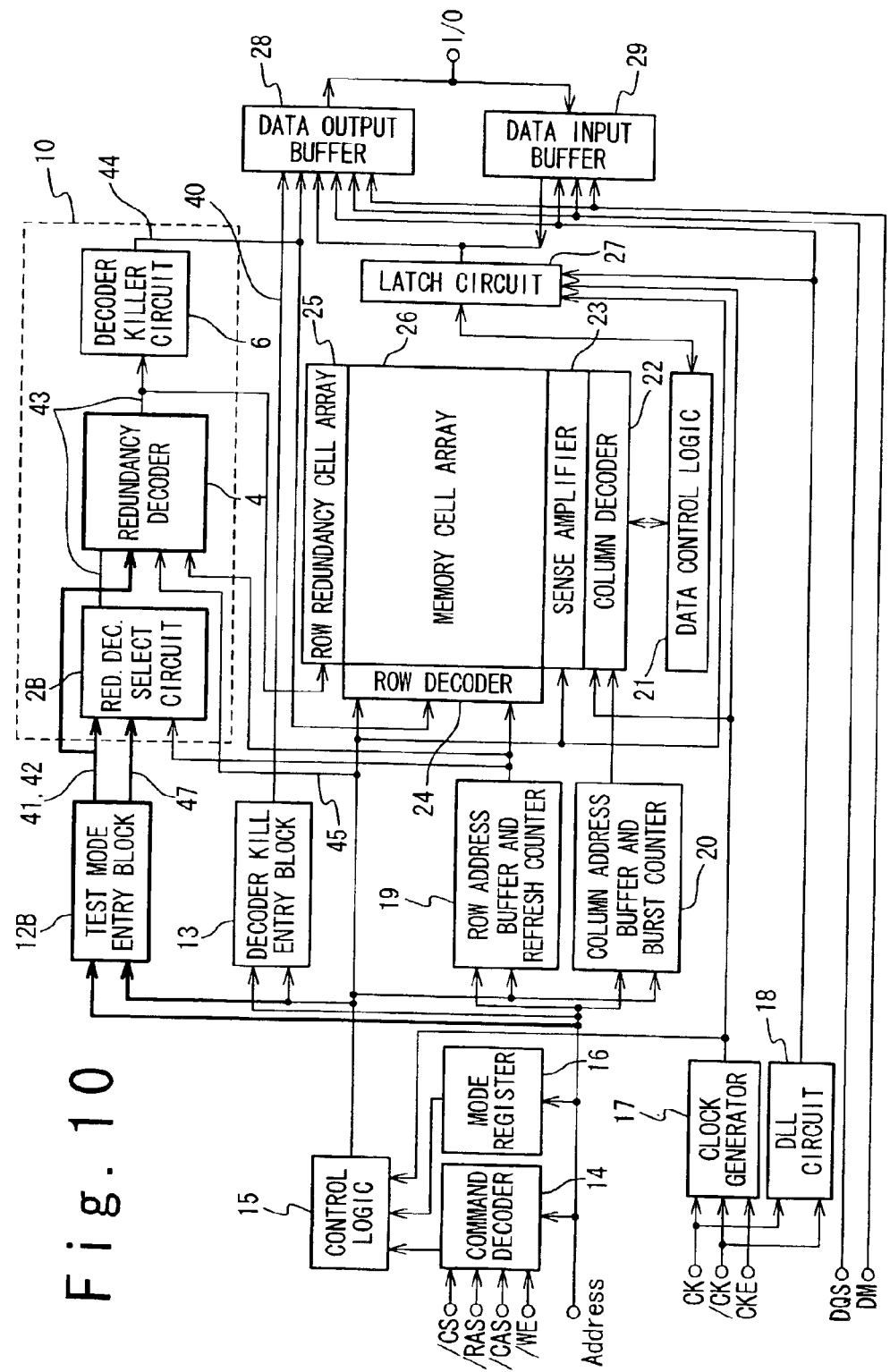
FIG. 10 is a block diagram showing the structure of the semiconductor memory device according to a third embodiment of the present invention.

Next, the semiconductor memory device with the redundancy circuit according to the third embodiment of the present invention will be described with reference to FIGS. 10 and 11. In the semiconductor memory device with the redundancy circuit according to the third embodiment, the address supplied to the redundancy decoder selecting circuit and the redundancy decoder in the first embodiment is common. The same components as those of FIGS. 4 and 5 are allocated with the same reference numerals and the detailed description will be omitted.

In the first embodiment, the address bits RA0 and RA1 are not a part of the address bits A0 to Aj and are supplied to the redundancy decoder selecting circuit 2B as the different address bits. However, in the third embodiment, a part of address bits A0 to Aj is used as the address bits RA0 and RA1. For example, the address bits A0 and A1 are used as the address bits RA0 and RA1 of the first embodiment. Because the address bits A0 to Aj are sometimes changed, it needed to be latched by the redundancy decoder selecting circuit 2B. Therefore, as shown in FIG. 10, the test mode entry block 12B generates a latch signal TLAT 47 in addition to the True test mode signal RTT 41 and the Not test mode signal RTN 42 and outputs them to the redundancy decoder selecting circuit 2B. In response to the latch signal TLAT 47, the address bits A0 and A1 are latched by the redundancy decoder selecting circuit 2B. In the third embodiment, the other structure is the same as that of the first embodiment.

Figure 11:
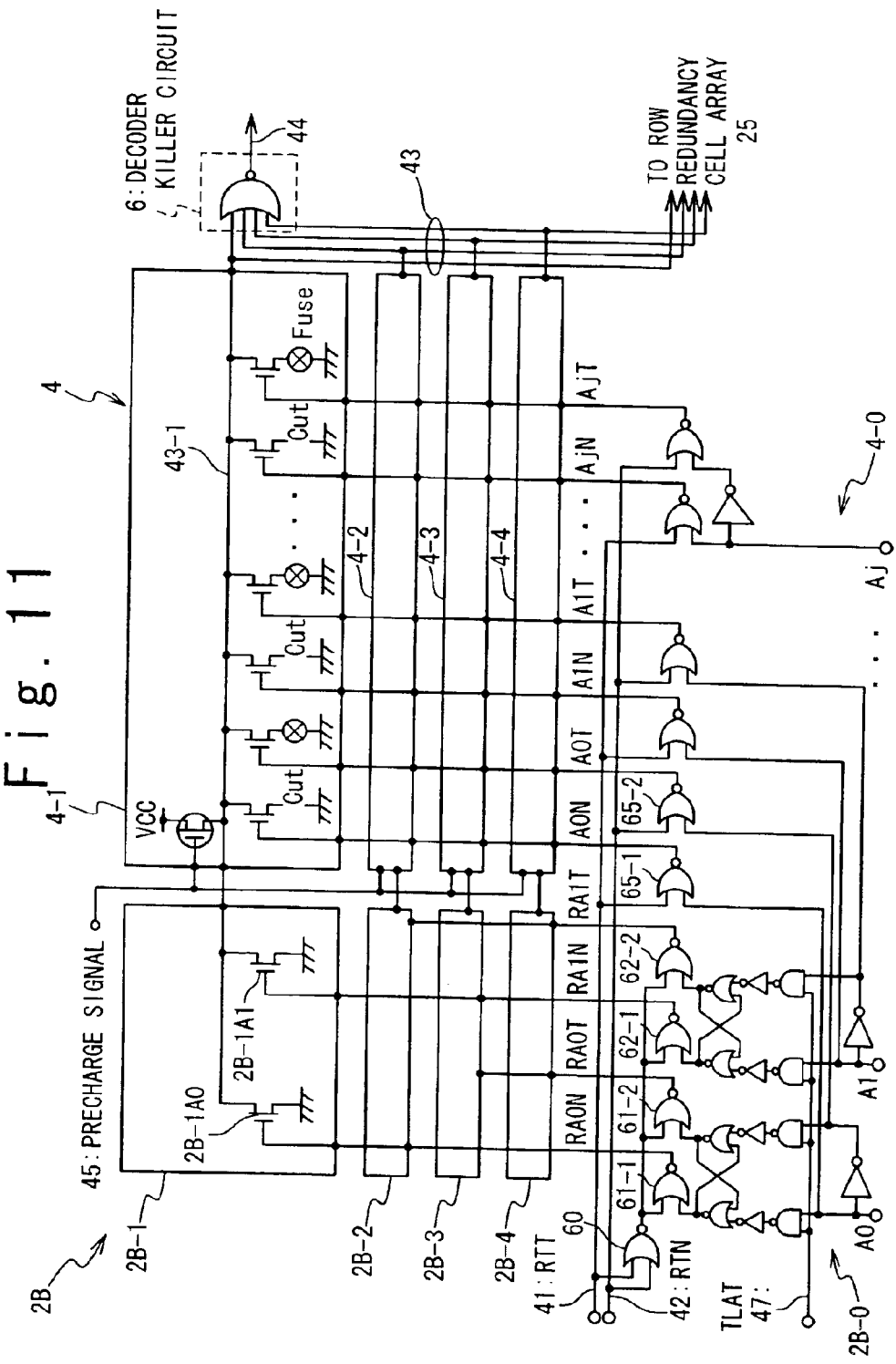
FIG. 11 is a block diagram showing the structure of the redundancy control circuit used in the semiconductor memory device according to the third embodiment of the present invention.

Referring to FIG. 11, the redundancy decoder 4 is the same as that of the first embodiment. Therefore, the description will be omitted.

Only the address setting circuit 2B-0 in the redundancy decoder selecting circuit 2B differs from that of the first embodiment. A flip-flop circuit is provided to be connected with the input of each of the NOR circuits 61-1 and 61-2 in place of the inverter 61-3 in the address setting circuit 2-0 of the first embodiment. An inverter circuit and a 2-input NAND circuit are provided for the input of each of the flip-flops. The latch signal TLAT 47 is supplied to one of the inputs of each NAND circuit. The address bit A0 and the inverted signal are supplied to the other input of each NAND circuit. As to the address bit A1, the same thing is true.

The address bits A0 to Aj are supplied first from the row address buffer 19 in the above structure. The latch signal TLAT is supplied from the test mode entry block 12 and a part of A0 and A1 of the address bits A0 to Aj is latched by the flip-flops. After that, the address bits A0 to Aj for the redundancy decoder 4 are supplied from the row address buffer 19. After that, the second embodiment operates in the same manner as the first embodiment. Thus, the redundancy control circuit 10 can operate in the above operation modes (1) to (5).

Because the operation of the redundancy decoder 4 and the redundancy decoder selecting circuit 2B and the structure of the other portion are same as those of the first embodiment as, and the description will be omitted.

If the address bits RA0 and RA1 are supposed to be supplied externally in the first embodiment, a lot of external terminals must be provided. However, in the third embodiment, because the inputted address of the address setting circuit 2B-0 of the redundancy decoder selecting circuit 2B and the address setting circuit 4-0 of the redundancy decoder 4 are common, it does not have to provide the external terminals as many as the first embodiment without lowering the function. Also, because the address is common, the circuit scale can be reduced.

Next, the semiconductor memory device according to the fourth embodiment of the present invention will be described with reference to FIGS. 12 to 17. In the fourth embodiment, the fuse corresponding to the address bits is one. In the fourth embodiment, the same reference numbers are allocated to the same components as those of the above first to third embodiments and the detailed description will be omitted.

Figure 12:
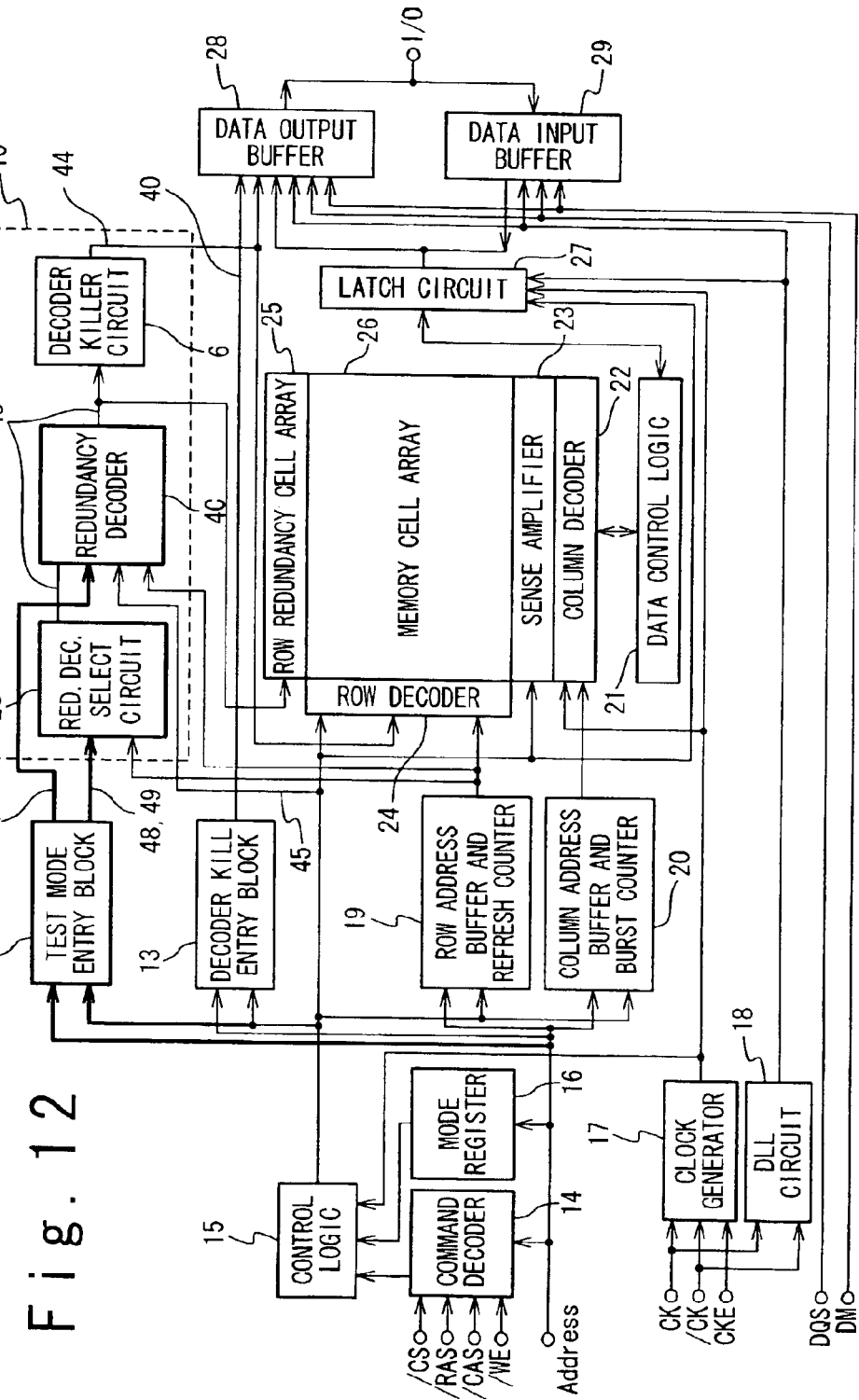
FIG. 12 is a block diagram showing the structure of the semiconductor memory device according to a fourth embodiment of the present invention.

Referring to FIG. 12, the fourth embodiment is different from the first embodiment in that the test mode entry block 12C generates the test mode signals TSEL1 48 and TSEL2 49 in addition to the True test mode signal RTT 41 and the Not test mode signal RTN 42. The test mode signals TSEL1 48 and TSEL2 49 are outputted to the redundancy decoder selecting circuit 2C but are not supplied to the redundancy decoder 4C. On the other hand, the True test mode signal RTT 41 and the Not test mode signal RTN 42 are not outputted to the redundancy decoder selecting circuit 2C but are supplied to the redundancy decoder 4C. The other structure of the fourth embodiment is same as that of the first embodiment.

Figure 14:
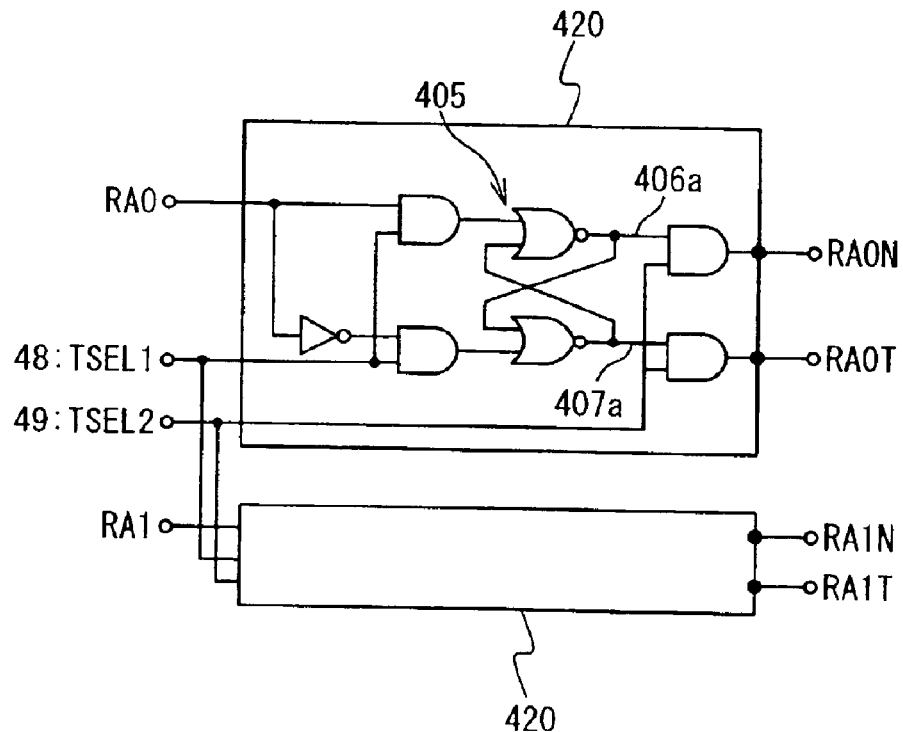
FIG. 14 is a block diagram showing the structure of an address setting circuit of a redundancy decoder selecting circuit used in the semiconductor memory device according to the fourth embodiment of the present invention.

The fourth embodiment differs from the first embodiment in the address setting circuit 2C-0 of the redundancy decoder selecting circuit 2C. The selecting circuits 2C-1, 2C-2, 2C-3, and 2C-4 have the same circuit structure as the selecting circuits 2-1, 2-2, 2-3, and 2-4. In the address setting circuit 2C-0, a selection address setting circuit 420 is provided to generate a True side signal and a Not side signal to each of the address bits RA0 and RA1, as shown in FIG. 14. The selection address setting circuit 420 has a flip-flop 405. A logical product of the address RA0 and the test mode signal TSEL1 48 is supplied to the inputs of the flip-flop 405. A logical product of the inverted signal of the address RA0 and the test mode signal TSEL1 48 is supplied to the other input of the flip-flop 405. A logical product of the output 406a of the flip-flop 405 and the test mode signal TSEL2 49 is outputted as the Not side signal RA0N. Also, a logical product of the output 407a of the flip-flop 405 and the test mode signal TSEL2 49 is outputted as the True side signal RA0T. The circuit 420 to the address bit RA1 also has the same structure. The signals RA0T, RA0N, RA1T and RA1N are supplied to the selecting circuits 2C-1, 2C-2, 2C-3, 2C-4 like the first embodiment. Thus, when the test mode signals TSEL1 48 and TSEL2 49 are in the H level, either of the selecting circuits 2C-1, 2C-2, 2C-3, 2C-4 can be selected based on the address bits RA0 and RA1. Also, when the test mode signal TSEL2 49 is in the L level, both of the True side output and the Not side output to the address bits are set to the L level, so that the redundancy decoder selecting circuit 2C can be set to the disable state.

Figure 13:
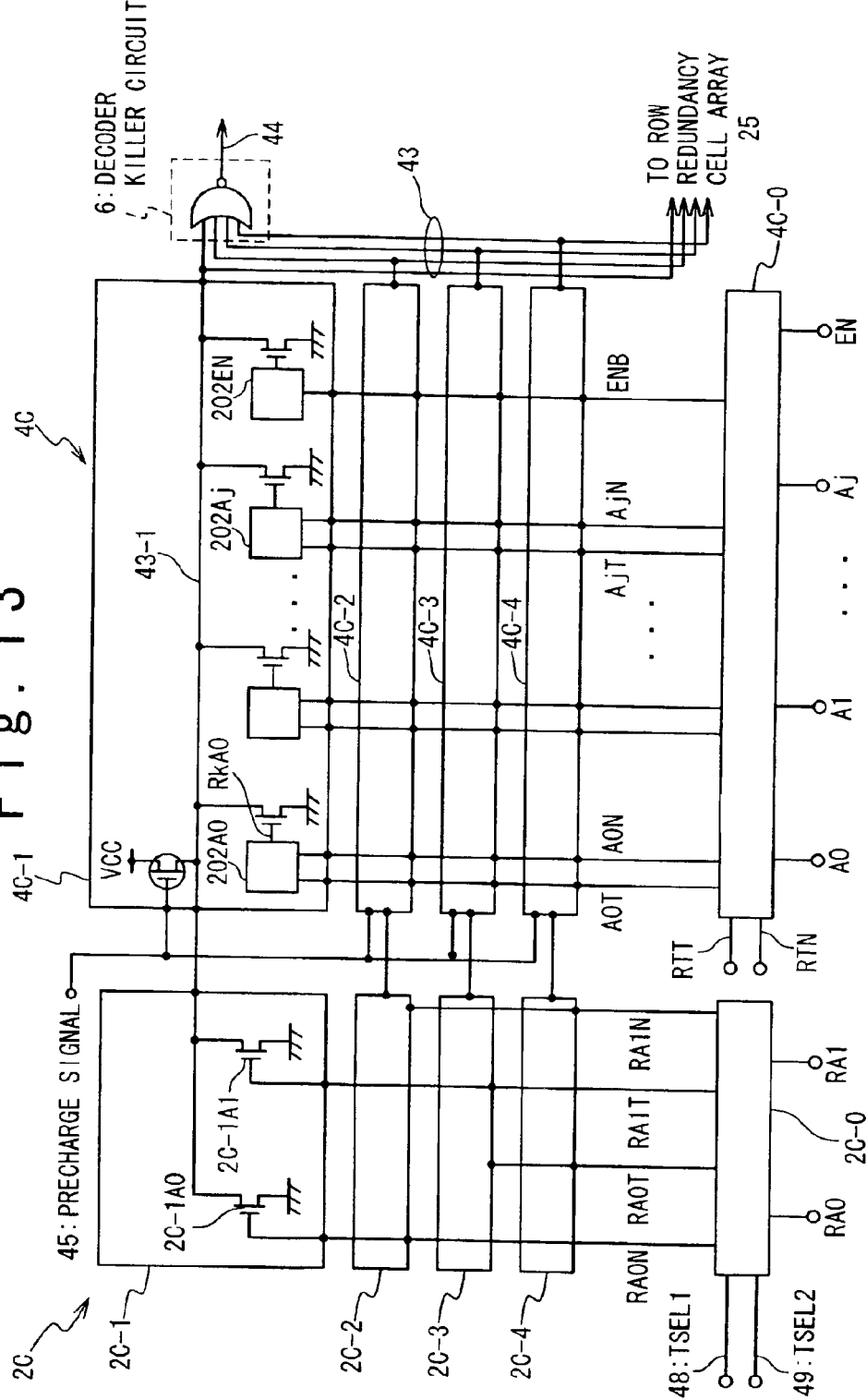
FIG. 13 is a block diagram showing the structure of the redundancy control circuit used in the semiconductor memory device according to the fourth embodiment of the present invention.
Figure 15:
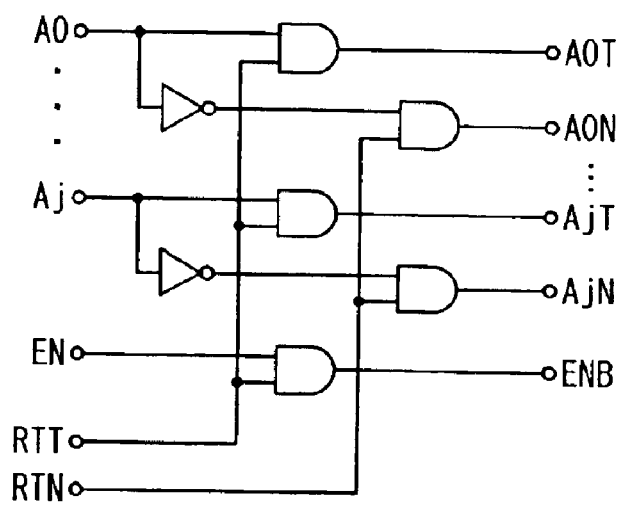
FIG. 15 is a block diagram showing the structure of an address setting circuit of the redundancy decoder used in the semiconductor memory device according to the fourth embodiment of the present invention.

Also, the fourth embodiment differs from the first embodiment in the address setting circuit 4C-0 of the redundancy decoder 4C. Although the address setting circuit is mainly composed of the NOR circuits in the first embodiment, the address setting circuit 4C-0 is composed of the AND circuits in the fourth embodiment. As shown in FIG. 15, the True test mode signal RTT 41, the Not test mode signal RTN 42, the address bits A0 to Aj and an enable signal EN are supplied to the address setting circuit 4C-0. As for the address bit A0, a logical product of the address bit A0 and the True test mode signal RTT 41 is outputted as a signal A0T. Also, a logical product of the inverted signal of the address bit A0 and the Not test mode signal RTN 42 is outputted as a signal A0N. The circuit for each of the address bits A1 to Aj is same as the circuit for the address bit A0. Also, as for the enable signal EN, a logical product of the enable signal EN and the True test mode signal RTT 41 is outputted as a signal ENB. As shown in FIG. 13, the signals A01T, A01N, . . . , AjT, and AjN and the enable signal ENB are together supplied to the fuse circuits 4C-1, 4C-2, 4C-3, 4C-4 of the redundancy decoder 4C.

The fuse circuits 4C-1, 4C-2, 4C-3, 4C-4 have the same circuit structure but the circuit structure is different from the fuse circuit 4-1 of the first embodiment. The fuse circuit 4C-1 has a fuse section 202 and an N-channel transistor to each of the address bits A0 to Aj and the enable signal ENB. The drain of the N-channel transistor is connected with the redundancy determination signal 43-1 and the source is grounded. An output of the fuse section 202 is connected with the gate. In this way, the level of the redundant inverted signal 43-1 is determined based on the output of the fuse section 202.

Figure 16:
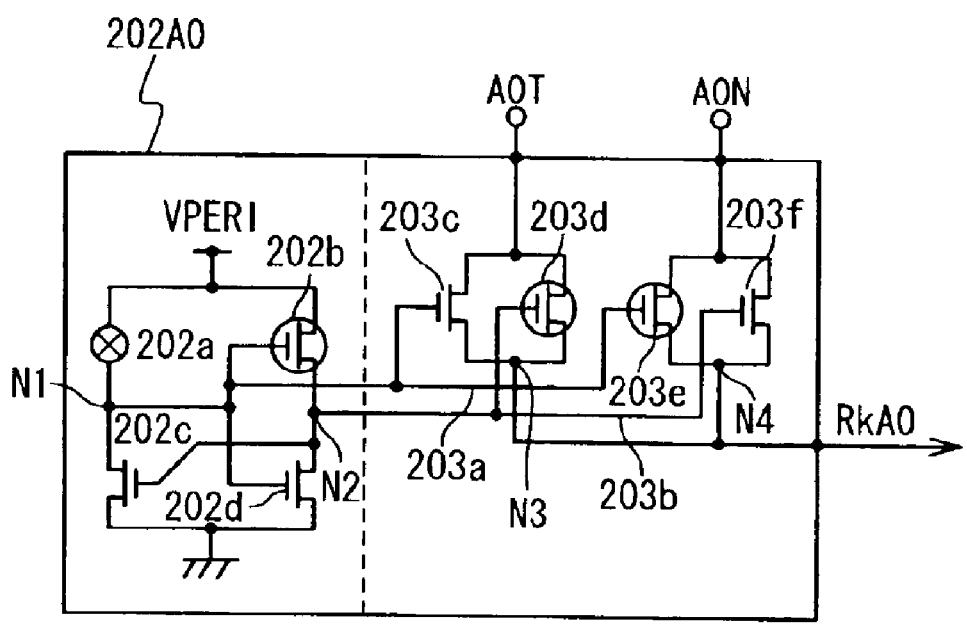
FIG. 16 is a block diagram showing the structure of a fuse section of a fuse circuit of the redundancy decoder used in the semiconductor memory device according to the fourth embodiment of the present invention.

The fuse section 202 to the address bit A0 is shown in FIG. 16. A fuse detecting circuit of the fuse section 202 is composed of a flip-flop which has a fuse 202a and a P-channel transistor 202b as load. The fuse 202a and the source of the P-channel transistor 202b are connected with a power supply voltage Vper1 in parallel. The drain of an N-channel transistor 202c is connected with one of the fuse 202a and the source is grounded. The drain of an N-channel transistor 202d is connected with the drain of the P-channel transistor 202b and the source is grounded. A node N1 between the fuse 202a and the N-channel transistor 202c is connected with the gate of each of the P-channel transistor 202b and the N-channel transistor 202d. A node N2 between the P-channel transistor 202b and the N-channel transistor 202d is connected with the gate of the N-channel transistor 202c. In case that the fuse 202a is not cut and is in a conductive state, the node N1 is set to the H level and the node N2 is set to the L level. When the fuse 202a is cut and is in the non-conductive state, the levels of the nodes N1 and N2 are set to opposite to the above.

An address generating circuit of the fuse section 202 has two transfer circuits which receive positive and complimentary signals 203a and 203b from the fuse detecting circuit. A transfer circuit is provided to the True side and the Not side of the redundant address bit A0. In the transfer circuit on the True side, the potential of the node N1 is supplied to the gate of the N-channel transistor and the potential of the node N2 is supplied to the gate of the P-channel transistor. On the other hand, in the transfer circuit on the Not side, the potential of the node N2 is supplied to the gate of the N-channel transistor and the potential of the node N1 is supplied to the gate of the P-channel transistor. The outputs of the transfer circuits on the True side and the Not side are wired-OR and outputted as a signal RkA0. The signal RkA0 is supplied to the gate of the N-channel transistor in the fuse circuit 4C-1 corresponding to the address bit A0. The fuse section of each of the other address bits A1 to Aj is same as the fuse section to the address bit A0. The enable signal ENB is supplied to the transfer gate of the True side and the ground potential is supplied to the transfer gate of the Not side.

Because the signal 203a is set to the H level and the signal 203b is set to the L level when the fuse 202a is not cut, the transfer gate on the True side is turned on, and the transfer circuit on the Not side is set to the OFF state and the address bit signal on the True side is outputted. That is, when the address bit A0 is in the L level, the signal RkA0 of the L level is outputted, and when the address bit A0 is in the H level, the signal RkA0 of the H level is outputted. Also, because the signal 203b is set to the H level and the signal 203a is set to the L level when the fuse 202a are cut, the signal RkA0 of the H level is outputted if the address bit A0 is in the L level, and the signal RkA0 of the L level is outputted if the address bit A0 is in the H level.

Below, the operation of the semiconductor memory device in the fourth embodiment will be described with reference to FIG. 17. FIG. 17 is a table showing the operation modes.

(1) In the normal operation mode, the test mode entry block 12C generates the True test mode signal RTT 41 and the Not test mode signal RTN 42 which are both in the H level, and the test mode signal TSEL2 49 of the L level based on the control signal from the control logic circuit 15 and the inputted address. The decoding kill entry block 13 outputs the decoding kill entry signal 40 of the L level to the data output buffer 28 based on the control signal from the control logic circuit 15 and the inputted address. All the outputs of the address bits RA0T, RA0N, RA1T and RA1N are set to the L level in the address setting circuit 2C-0 because of the test mode signal TSEL2 49 of the L level, and the redundancy decoder selecting circuit 2C is set to the disable state. Also, because the True test mode signal RTT 41 and the Not test mode signal RTN 42 are in the H level, the address bits A0N to AjN and A0T to AjT and the enable signal ENB are supplied to the fuse sections of the fuse circuits. If a signal of the H level is outputted from the fuse section, the corresponding N-channel transistor is set to the ON state and the redundancy determination signal 43 is set to the L level. If the signals of the L level are outputted from all the fuse sections, the N-channel transistors are set to the OFF state and the redundancy determination signal 43 is set to the H level. As a result, the decoder killer circuit 6 outputs the decoder killer signal 44 of the L level. After that, the same operation as in the first embodiment is carried out.

(2) In the redundant cell check test mode, the test mode entry block 12C generates the True test mode signal RTT 41 and the Not test mode signal RTN 42, which are both in the L level, and the test mode-signals TSEL1 and TSEL2 49 of the H level based on the control signal from the control logic circuit 15 and the inputted address. The decoding kill entry block 13 outputs the decoding kill entry signal 40 of the L level to the data output buffer 28 based on the control signal from the control logic circuit 15 and the inputted address. Because the True test mode signal RTT 41 and the Not test mode signal RTN 42 are both in the L level, all the address bits of the L level are outputted from the address setting circuit 4C-0 of the redundancy decoder 4C. As a result, regardless of whether the fuse in the fuse section is cut, the signals RkA0 to RkAj and a signal of the L level corresponding to the enable signal ENB are outputted from the fuse section. As a result, the redundancy decoder 4C is set to the disable state. On the other hand, because the test mode signal TSEL1 48 and TSEL2 49 are both in the H level, the output levels of the address bits RA0T, RA0N, RA1T and RA1N depend on the address bits RA0 and RA1 in the address setting circuit 2C-0. In this way, the operation of the redundant cell check test mode is possible like the first embodiment.

(3) In the roll call test mode, the test mode entry block 12C generates the True test mode signal RTT 41 and the Not test mode signal RTN 42, which are both in the H level, and the test mode signal TSEL2 49 of the L level based on the control signal from the control logic circuit 15 and the inputted address. The decoding kill entry block 13 outputs the decode kill entry signal 40 of the H level to the data output buffer 28 based on the control signal from the control logic circuit 15 and the inputted address. In the address setting circuit 2C-0, all the outputs of the address bit signals RA0T, RA0N, RA1T and RA1N are set to the L level in response to the test mode signal TSEL2 49 of the L level, and the redundancy decoder selecting circuit 2C is set to the disable state (the non-selected state). Also, because the True test mode signal RTT 41 and the Not test mode signal RTN 42 are in the H level, the address bits A0N to AjN and A1T to AjT and the enable signal ENB are supplied to the fuse section of each fuse circuit. If the signal of the H level is outputted from the fuse section, the corresponding N-channel transistor is set to the ON state and the redundancy determination signal 43 is set to the L level. If the signals of the L level are outputted from all the fuse sections, the N-channel transistors are set to the OFF state and the redundancy determination signal is set to in the H level. As a result, the decoder killer circuit 6 outputs the decoder killer signal 44 of the L level. After that, the same operation as in the first embodiment is carried out.

(4) In the fuse check test mode, the test mode entry block 12C generates the True test mode signal RTT 41 and the Not test mode signal RTN 42, in which one is the H level and the other is the L level, and the test mode signals TSEL1 48 and TSEL2 49, which are both in the H level, based on the control signal from the control logic circuit 15 and the inputted address. The decoding kill entry block 13 outputs the decode kill entry signal 40 of the H level to the data output buffer 28 based on the control signal from the control logic circuit 15 and the inputted address. In the address setting circuit 2C-0, all the outputs of the address bits RA0T, RA0N, RA1T and RA1N depend on the address bits RA0 and RA1 because of the test mode signals TSEL1 48 and TSEL2 49 of the H level. Also, because one of the True test mode signals RTT 41 and the Not test mode signals RTN 42 is in the L level, all the signal levels are set to the L level in either of the sets of the address bits A0T to AjT and signal ENB and the set of the address bit signals A0N to AjN. For example, if the signal RTT is in the L level, all the signal levels of the address bits A1T to AjT and the signal ENB are set to the L level. Also, if the signal RTN is the L level, all the signal levels of the address bits A0N to AjN are set to the L level. In this way, one on the True side and the Not side can be selected. In this way, it is possible to check whether or not each fuse of the fuse circuit is cut by carrying out the same operation as in the first embodiment.

In the above-mentioned description, the address bits RA0 and RA1 for the redundant test are latched in response to the control signal TSEL1. This is a method adopted when the address bits RA0 and RA1 are a part of the address bits A0 to A1. On the other hand, the signal TSEL1 and the flip-flop 405 are unnecessary if the address bits A0 to Aj and the address bits RA0 and RA1 are independently inputted. Also, because the enable signal ENB is a signal generated in the circuit, it is unnecessary for the test mode entry block 12 to generate the control signal if the H level/L level of the control signal is selected in accordance with each operation mode and the control signal is outputted.

In the first to third embodiments, two fuse sections of the True side and the Not side are provided for each of the address bits supplied to the redundancy decoder 4. However, in the fourth embodiment, one fuse section is provided for each of the address bits supplied to the redundancy decoder 4. In this way, even if one fuse is provided for each address bit, the effects from the first embodiment to the third embodiment can be held.

As described above, the fuse method is dealt in which a defective address is programmed in the fuses by destroying the fuses physically with the laser in the first to fourth embodiments. However, the present invention can be applied to a fuse destruction method (a polysilicon circuit, a capacitor plate, and a metal wiring line), an electrical fuse destruction method (a capacitor insulating film, a circuit insulating film), and a fuse non-destruction method (a non-volatile memory like EEPROM and EPROM).

In accordance with the redundancy control circuit of the present invention, it is possible to check whether or not data of the defective address is programmed in a specific fuse.

What is claimed is:

1. A redundancy control circuit comprising:
a redundancy decoder comprising a plurality of fuse circuits corresponding to a plurality of determination signals which are previously activated, wherein each of said plurality of fuse circuits contains a plurality of fuse sections, and each of said fuse sections contains a fuse; and
a decoder killer circuit which generates a killer signal when at least one of said plurality of determination signals is active, said killer signal is outputted to an external unit in a first check mode,
wherein one of said plurality of fuse circuits is selected based on a first control signal and first address bits of a first address in said first check mode, and said determination signals corresponding to the non-selected fuse circuits are inactivated, and
a specific one of said plurality of fuse sections of said selected fuse circuit inactivates said determination signal corresponding to said selected fuse circuit based on whether said fuse of said specific fuse section is cut in said first check mode, and each of said plurality of fuse sections of said selected fuse circuit other than said specific fuse section does not inactivate said determination signal.

2. The redundancy control circuit according to claim 1, wherein each of said plurality of fuse sections is provided for each of a true-side and a not-side to each of said second address bits.

3. The redundancy control circuit according to claim 1, wherein each of said plurality of fuse sections is provided for each of said second address bits.

4. The redundancy control circuit according to claim 1, wherein said redundancy decoder further comprises a redundancy decoder address setting circuit which selects said specific fuse section of said selected fuse circuit based on second and third control signals and second address bits of a second address in said first check mode.

5. The redundancy control circuit according to claim 4, wherein said first address and said second address are different from each other.

6. The redundancy control circuit according to claim 4, wherein said first address bits is part of said second address bits.

7. The redundancy control circuit according to claim 4, wherein said first control signal contains said second and third control signals.

8. The redundancy control circuit according to claim 4, wherein said first control signal contains fourth and fifth control signals which are different from said second and third control signals.

9. The redundancy control circuit according to claim 4, further comprising:
a redundancy decoder selecting circuit which selects as said selected fuse circuit, one of said plurality of fuse circuits based on said first control signal and said first address bits in said first check mode.

10. The redundancy control circuit according to claim 9, further comprising:
an address circuit which outputs said first address to said redundancy decoder selecting circuit and said second address to said redundancy decoder, while changing a bit position of a specific one among said second address bits,
wherein said specific second address bit corresponds to said specific fuse section, and
a value of said specific second address bit of said second address bits is different from values of the other second address bits.

11. The redundancy control circuit according to claim 9, wherein said redundancy decoder selecting circuit comprises:
a plurality of selecting circuits provided for said plurality of fuse circuits, and
wherein one of said plurality of selecting circuits which is selected based on said first control signal and said first address bits keeps said corresponding determination signal active and selects said corresponding fuse circuit in said first check mode.

12. The redundancy control circuit according to claim 11, wherein said determination signals are precharged up to a higher voltage, and
each of said fuse sections comprises:
said fuse, one end of which is grounded; and
an N-channel transistor having a drain connected with said corresponding determination signal, a source connected with the other end of said fuse, and a gate connected with a signal obtained from one of said second address bits corresponding to said fuse section and said second and third control signals.

13. The redundancy control circuit according to claim 11, wherein one of said plurality of fuse circuits is selected based on said second and third control signals and said second address bits in a second check mode, said determination signals corresponding to said non-selected fuse circuits are inactivated, and each of said plurality of selecting circuit selectively inactivates said corresponding determination signal based on said first control signal and said first address bits in said second check mode.

14. A semiconductor memory device comprising:

a memory cell array containing a plurality of memory cell rows;

a row decoder which selects one of said plurality of memory cell rows based on a first part of a read address in an operation mode, said row decoder being disabled in response to a killer data;

a redundancy cell array containing a plurality of redundancy memory cell rows, one of which is selected based on an active determination signal in said operation mode;

a column decoder which selects a memory cell of said selected memory cell row or said selected redundancy memory cell row based on a second part of said read address in said operation mode;

an output section which outputs said killer data in response to a kill entry signal in a first check mode and outputs data from said selected memory cell in said operation mode;

a decoder kill entry block which generates said kill entry signal in said first check mode;

a test mode block which generates first to third control signals in said first check mode;

a redundancy control circuit which comprises a redundancy decoder and a decoder killer circuit, wherein said redundancy decoder comprises a plurality of fuse circuits corresponding to a plurality of determination signals which are previously activated, wherein each of said plurality of fuse circuits contains a plurality of fuse sections, and each of said fuse sections contains a fuse, and said decoder killer circuit generates said killer data when at least one of said plurality of determination signals is active, one of said plurality of fuse circuits is selected based on the first control signal and first address bits of a first address in said first check mode, and said determination signals corresponding to the non-selected fuse circuits are inactivated, and a specific one of said plurality of fuse sections of said selected fuse circuit inactivates said determination signal corresponding to said selected fuse circuit based on whether said fuse of said specific one is cut in said first check mode, and each of said plurality of fuse sections other than said specific fuse section does not inactivate said determination signal, and said active determination signal is outputted from said redundancy decoder to said redundancy cell array.

15. The semiconductor memory device according to claim 14, wherein each of said plurality of fuse sections is provided for each of a true-side and a not-side to each of said second address bits.

16. The semiconductor memory device according to claim 14, wherein each of said plurality of fuse sections is provided for each of said second address bits.

17. The semiconductor memory device according to claim 14, wherein said redundancy decoder further comprises a redundancy decoder address setting circuit which selects said specific fuse section of said selected fuse circuit based on the second and third control signals and second address bits of a second address in said first check mode.

18. The semiconductor memory device according to claim 17, wherein said first address and said second address are different from each other.

19. The redundancy control circuit according to claim 17, wherein said first address bits is part of said second address bits.

20. The semiconductor memory device according to claim 17, wherein said first control signal contains said second and third control signals.

21. The redundancy control circuit according to claim 17, wherein said first control signal contains fourth and fifth control signals which are different from said second and third control signals.

22. The semiconductor memory device according to claim 17, further comprising:

a redundancy decoder selecting circuit which selects as said selected fuse circuit, one of said plurality of fuse circuits based on said first control signal and said fist address bits in said first check mode.

23. The redundancy control circuit according to claim 22, further comprising:

an address circuit which outputs said first address to said redundancy decoder selecting circuit and said second address to said redundancy decoder, while changing a bit position of a specific one among said second address bits, wherein said specific second address bit corresponds to said specific fuse section, and a value of said specific second address bit of said second address bits is different from values of the other second address bits.

24. The semiconductor memory device according to claim 22, wherein said redundancy decoder selecting circuit comprises:

a plurality of selecting circuits provided for said plurality of fuse circuits, and wherein one of said plurality of selecting circuits which is selected based on said first control signal and said first address bits keeps said corresponding determination signal active and selects said corresponding fuse circuit in said first check mode.

25. The redundancy control circuit according to claim 24, wherein said determination signals are precharged up to a higher voltage, and each of said fuse sections comprises:

said fuse, one end of which is grounded; and an N-channel transistor having a drain connected with said corresponding determination signal, a source connected with the other end of said fuse, and a gate connected with a signal obtained from one of said second address bits corresponding to said fuse section and said second and third control signals.

26. The redundancy control circuit according to claim 24 or 25, wherein one of said plurality of fuse circuits is selected based on said second and third control signals and said second address bits in a second check mode, said determination signals corresponding to said non-selected fuse circuits are inactivated, and each of said plurality of selecting circuit selectively inactivates said corresponding determination signal based on said first control signal and said first address bits in said second check mode.

* * * * *